(12) United States Patent
Marks et al.

(10) Patent No.: US 12,360,058 B2
(45) Date of Patent: Jul. 15, 2025

(54) INTEGRATION OF AN OPTICAL HEIGHT SENSOR IN MASK INSPECTION TOOLS

(71) Applicant: KLA Corporation, Milpitas, CA (US)

(72) Inventors: Zefram Marks, Fremont, CA (US); Dmitry Skvortsov, San Jose, CA (US); Zhengyu Guo, Milpitas, CA (US); Zhengcheng Lin, San Jose, CA (US); Nicolas Steven Juliano, Milpitas, CA (US); Rui-Fang Shi, Cupertino, CA (US)

(73) Assignee: KLA Corporation, Milpitas, CA (US)

(*) Notice: Subject to any disclaimer, the term of this patent is extended or adjusted under 35 U.S.C. 154(b) by 470 days.

(21) Appl. No.: 17/352,361

(22) Filed: Jun. 21, 2021

(65) Prior Publication Data
US 2022/0196572 A1    Jun. 23, 2022

Related U.S. Application Data

(60) Provisional application No. 63/128,183, filed on Dec. 21, 2020.

(51) Int. Cl.
G01N 21/956 (2006.01)
G01B 11/06 (2006.01)
G01N 21/45 (2006.01)

(52) U.S. Cl.
CPC ....... *G01N 21/956* (2013.01); *G01B 11/0608* (2013.01); *G01N 21/45* (2013.01);
(Continued)

(58) Field of Classification Search
CPC ................. G01N 21/956; G01N 21/45; G01N 2021/451; G01N 2021/95676; G01B 11/0608
See application file for complete search history.

(56) References Cited

U.S. PATENT DOCUMENTS 5,500,326 A * 3/1996 Kobayashi .......... G03F 7/70425
430/300
6,184,992 B1 2/2001 Durán et al.
(Continued)

FOREIGN PATENT DOCUMENTS

CN       103135366 A  *  6/2013

OTHER PUBLICATIONS

PCT/US2021/064259, International Search Report, Jun. 7, 2022.
(Continued)

*Primary Examiner* — Michelle M Iacoletti
*Assistant Examiner* — Jarreas Underwood
(74) *Attorney, Agent, or Firm* — Huse IP Law

(57) ABSTRACT

A photomask-inspection system includes a vacuum chamber and a stage, disposed in the vacuum chamber, to support a photomask and to translate the photomask horizontally and vertically. The system also includes an EUV objective, disposed in the vacuum chamber, to collect EUV light from the photomask to inspect the photomask for defects and an optical height sensor, at least partially disposed in the vacuum chamber, to measure heights on a surface of the photomask. The system further includes a stage controller to translate the stage horizontally and vertically in accordance with a focal map for the photomask produced using the measured heights on the surface of the photomask.

24 Claims, 14 Drawing Sheets

(52) U.S. Cl.
CPC ............... *G01N 2021/451* (2013.01); *G01N 2021/95676* (2013.01)

(56) References Cited

U.S. PATENT DOCUMENTS

| | | | |
|---|---|---|---|
| 7,835,015 B1* | 11/2010 | Wright | G01B 11/0608 |
| | | | 356/609 |
| 9,110,039 B2* | 8/2015 | Wright | G01N 21/956 |
| 9,865,047 B1* | 1/2018 | Chen | G01B 11/306 |
| 10,859,922 B1 | 12/2020 | Yu et al. | |
| 11,156,925 B2* | 10/2021 | Kimman | G03F 7/70758 |
| 2004/0217287 A1* | 11/2004 | Watanabe | B82Y 10/00 |
| | | | 250/310 |
| 2007/0057184 A1* | 3/2007 | Uto | H01J 37/226 |
| | | | 250/307 |
| 2007/0085987 A1 | 4/2007 | Ottens et al. | |
| 2009/0092905 A1 | 4/2009 | Nakaue et al. | |
| 2010/0149505 A1* | 6/2010 | Sewell | G03F 7/70208 |
| | | | 250/559.4 |
| 2011/0090511 A1* | 4/2011 | Medicus | G01B 9/0209 |
| | | | 356/511 |
| 2012/0081538 A1 | 4/2012 | Ogawa et al. | |
| 2013/0293879 A1 | 11/2013 | Honda et al. | |
| 2014/0002826 A1* | 1/2014 | Inoue | G01N 21/95607 |
| | | | 356/601 |
| 2015/0346609 A1 | 12/2015 | Boef | |
| 2017/0082552 A1* | 3/2017 | Kim | G02B 13/0095 |
| 2017/0249753 A1 | 8/2017 | Otani et al. | |
| 2018/0017372 A1* | 1/2018 | Conley | G01B 9/02002 |
| 2019/0137869 A1* | 5/2019 | Tang | G03F 7/2002 |
| 2019/0354915 A1* | 11/2019 | Hockett | G06F 30/00 |
| 2020/0394778 A1* | 12/2020 | Yoshitake | G21K 7/00 |
| 2021/0018595 A1* | 1/2021 | McFadden | G01S 13/887 |
| 2021/0109030 A1 | 4/2021 | Shi et al. | |
| 2022/0353424 A1* | 11/2022 | Takeda | G06T 7/50 |

OTHER PUBLICATIONS

PCT/US2021/064259, Written Opinion of the International Searching Authority, Jun. 7, 2022.

Daniel Malacara et al., Interferogram Analysis for Optical Testing, CRC Press (2nd ed. 2005), sections 5.1-5.3 and 6.1-6.4 (pp. 159-179 and 259-284).

PCT/US2020/055173, International Search Report, Jan. 20, 2021.

PCT/US2020/055173, Written Opinion of the International Searching Authority, Jan. 20, 2021.

\* cited by examiner

INTEGRATION OF AN OPTICAL HEIGHT SENSOR IN MASK INSPECTION TOOLS

RELATED APPLICATION

This application claims priority to U.S. Provisional Patent Application No. 63/128,183, filed on Dec. 21, 2020, which is incorporated by reference in its entirety for all purposes.

TECHNICAL FIELD

This disclosure relates to photomask (i.e., reticle) inspection, and more specifically to integration of an optical height sensor for focal mapping in photomask-inspection tools.

BACKGROUND

Controlling the focal distance between a photomask and imaging optics during photomask inspection is important for defect-inspection sensitivity and repeatability. Focal-distance control is especially important for inspection of extreme ultraviolet (EUV) photomasks. For example, different defects can exhibit different through-focus behaviors, making focus control important for optimal and consistent defect detection in a reticle inspection tool.

To control focus variation, the shape of the photomask is mapped before inspection. This process, which is referred to as focal mapping, produces a focal map that provides a trajectory to be followed during inspection to control the focal distance. For example, a servo control system may be used to adjust the imaging optics so that they follow the trajectory during inspection.

Focal mapping of modern (e.g., EUV) photomasks, however, presents significant challenges. Traditional focal-mapping processes have used candidate positions in non-patterned areas on a photomask. The small pattern features and high pattern densities on modern photomasks make it difficult to find suitable non-patterned candidate positions. And three-dimensional electromagnetic effects associated with the high pattern densities cause focal offsets measured for patterned areas on photomasks to be incorrect, resulting in incorrect focal maps and trajectories.

SUMMARY

Accordingly, there is a need for photomask-inspection systems that can implement accurate and quick focal-mapping techniques.

In some embodiments, a photomask-inspection system includes a vacuum chamber and a stage, disposed in the vacuum chamber, to support a photomask and to translate the photomask horizontally and vertically. The system also includes an EUV objective, disposed in the vacuum chamber, to collect EUV light from the photomask to inspect the photomask for defects and an optical height sensor, at least partially disposed in the vacuum chamber, to measure heights on a surface of the photomask. The system further includes a stage controller to translate the stage horizontally and vertically in accordance with a focal map for the photomask produced using the measured heights on the surface of the photomask.

In some embodiments, a method includes positioning a photomask on a stage in a vacuum chamber, measuring heights of patterned areas on a surface of the photomask using an optical height sensor that is at least partially disposed in the vacuum chamber, and producing a focal map for the photomask using the measured heights on the surface of the photomask. The method further includes inspecting the photomask for defects using an EUV objective disposed in the vacuum chamber. To inspect the photomask, the stage is translated horizontally and vertically in accordance with the focal map.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
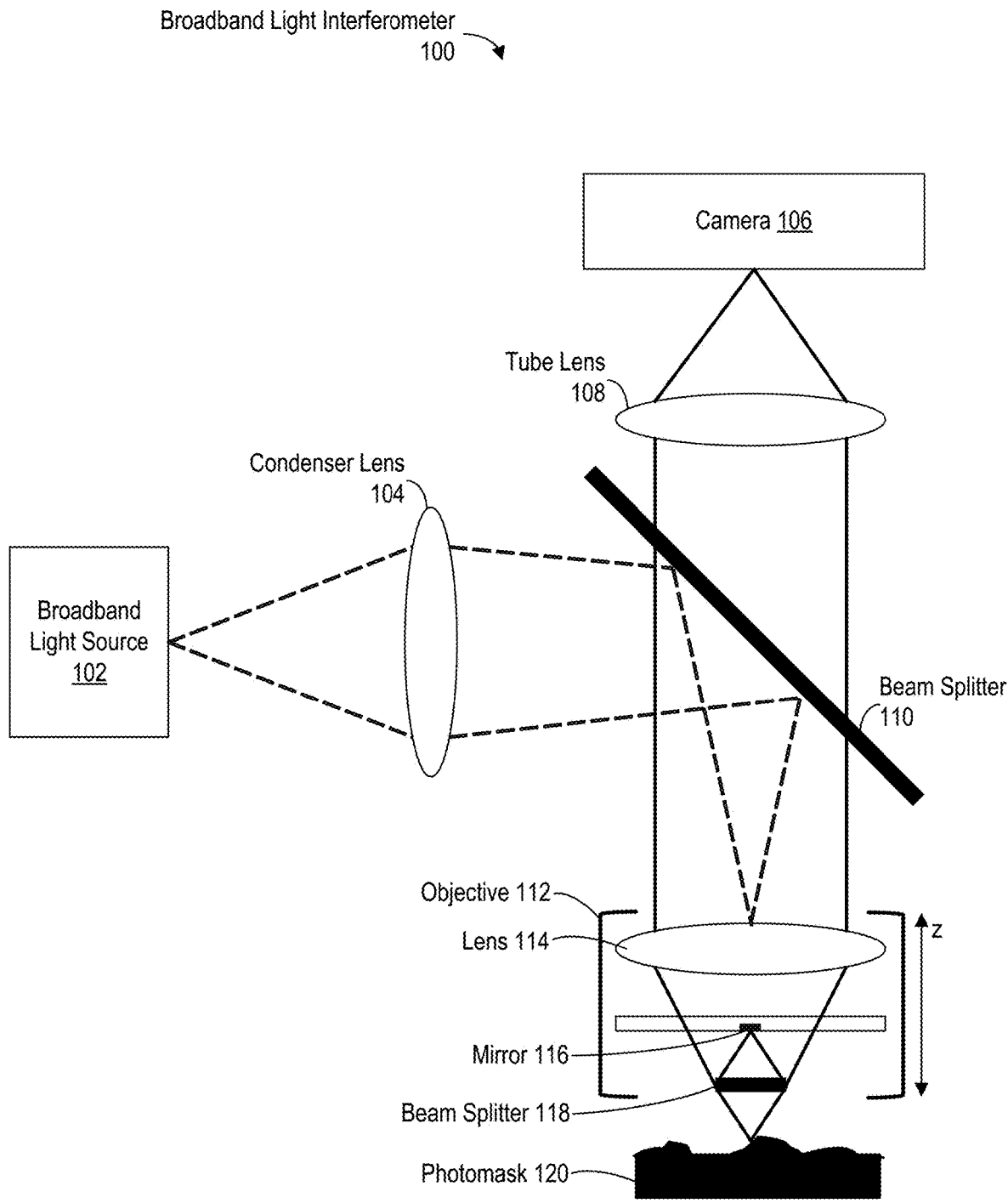
FIG. 1 shows a broadband light interferometer used to image a photomask to determine heights of respective areas on the surface of the photomask, in accordance with some embodiments.

FIG. 1 shows a broadband light interferometer 100 used to image (i.e., generate interferograms for) a photomask 120 to determine heights of respective areas on the surface of the photomask 120, in accordance with some embodiments. Patterning and bowing of the photomask 120 cause different areas on the surface of the photomask 120 to have different heights. The broadband light interferometer 100 has a low numerical aperture (NA). For example, the NA for the broadband light interferometer 100 is less than 0.15 (e.g., equals 0.10 or 0.075). The broadband light interferometer 100 performs Mirau interferometry. Alternatively, another type of broadband light interferometer (e.g., a Michelson interferometer) may be used to image the photomask 120.

The broadband light interferometer 100 includes a broadband light source 102. The broadband light interferometer 100 may also be referred to as a white light interferometer. (The term "white" in this context merely indicates that the corresponding light has a band of wavelengths and does not imply a particular band of wavelengths.) The use of broadband light (i.e., white light) reduces temporal coherence of the light for fringe-nulling purposes. In some embodiments, the broadband light source 102 provides visible light. In some embodiments, the wavelength band (e.g., color) of the light provided by the broadband light source 102 is adjustable. For example, light-emitting diodes (LEDs) and/or filters in the broadband light source 102 may be changed to change the wavelength band. In another example, the broadband light interferometer 100 may have multiple broadband light sources 102 that can be multiplexed into the optical path, each of which provides a different wavelength band.

A condenser lens 104 focuses light from the broadband light source 102 onto an objective 112 (i.e., an interferometric objective), which is a Mirau-type objective in the example of FIG. 1. A beam splitter 110 is situated between the condenser lens 104 and the objective 112 in the optical path to reflect the light from the broadband light source 102 onto the objective 112. The objective 112 includes a lens 114, mirror 116, and beam splitter 118 in sequence. The beam splitter 118 illuminates the surface of the photomask 120 with a portion of the light from the broadband light source 102 while reflecting, in conjunction with the mirror 116, another portion of the light from the broadband light source 102. The reflected portion serves as the reference light for the broadband light interferometer 100. The objective 112 collects light from the photomask 120. The collected light and the reference light, which interfere, are collimated by the lens 114 and transmitted through the beam splitter 110 to a tube lens 108, which focuses them onto a camera 106 (e.g., a digital camera).

The image (i.e., interferogram) produced in the camera 106 includes interference effects resulting from interference between the collected light from the photomask and the reference light. The interference effects vary as a function of the height of the objective 112 above the photomask 120. The height of the objective 112 above the photomask 120 is adjustable. For example, the objective 112 may be on a z-scanning stage that can move the objective 112 up and down along the z-axis (i.e., adjust the z-height). The z-height can also be adjusted by moving the photomask under the objective with a z-scanning stage. Multiple images (i.e., interferograms) of the photomask 120 may be taken with the objective 112 at different heights (i.e., z-values) above the photomask 120, and the heights of respective areas on the surface of the photomask 120 may be determined by comparing the images, using interferogram analysis (e.g., known three-, four-, or five-step interferogram-based analysis algorithms).

The heights measured for patterned areas on the surface of the photomask will be incorrect due to the three-dimensional electromagnetic effects, however, and therefore cannot be directly used to produce a focal map for defect inspection. For example, assuming NA=0.10 and a central wavelength of 500 nm for the broadband light source 102 (which is an extended spatially incoherent light source), the smallest pitch that the broadband light interferometer 100 can resolve is $\lambda/(2*NA)$=2.5 um. This value is far above the pitch for patterns on photomasks for modern deep-submicron semiconductor devices. Below this pitch limit, the broadband light interferometer 100 observes an average effect of the dense patterns on the photomask 120 without resolving the features, such that only the zeroth-order diffracted light from the photomask 120 will interfere with the reference light. This effect results in incorrect height measurements. The error in the measured height varies as a function of the fill factor (e.g., defined as the area percentage not covered by absorber material 204, FIG. 2) for a patterned area on the photomask 120. The following discussion describes techniques for determining corrections to apply to the incorrect (i.e., uncorrected) height measurements, to produce corrected height values that may be used in a focal map of defect inspection. The corrections may be determined based on the fill factors. In some embodiments, the produced height values for the focal map are substantially pattern-independent: they depend on the fill-factor correction but not on the details of the patterns.

Figure 2:
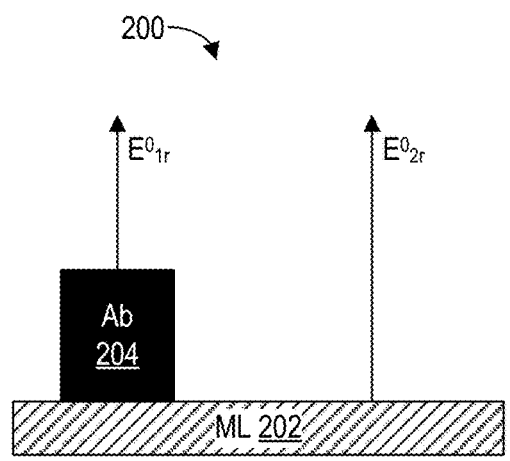
FIG. 2 is a side cross-sectional view of a patterned area on the surface of a photomask.

FIG. 2 is a side cross-sectional view of a patterned area 200 on the surface of the photomask 120. A portion of the patterned area 200 is covered by an absorber material (Ab) 204, which absorbs ultraviolet light (e.g., extreme ultraviolet light). The absorber material 204 is situated above a multilayer material (ML) 202. The remainder of the patterned area 200 is not covered by the absorber material 204, such that the multilayer material 202 is exposed. The multilayer material 202 (imperfectly) reflects light.

In some embodiments, the photomask 120 is for EUV (e.g., 13.5 nm) photolithography. The absorber material 204 absorbs the EUV (e.g., 13.5 nm) light and the multilayer material 202 partially reflects the EUV (e.g., 13.5 nm) light. The multilayer material 202 includes alternating layers of molybdenum (Mo) and silicon (Si) above a substrate (e.g., a blank photomask), with a capping layer covering the alternating layers of Mo and Si. The capping layer may be ruthenium (Ru). Each pair of adjacent Mo and Si layers is called a MoSi bilayer. The Mo layer thickness may be 2.8 nm, the Si layer thickness may be 4.2 nm, and the capping layer thickness may be 2.5 nm. The number of MoSi bilayers in the multilayer material 202 may be 40 or more, or 35 or more. The absorber material 204 includes a tantalum boron nitride (TaBN) layer with a tantalum boron oxide (TaBO) capping layer above the TaBN layer. The TaBO capping layer has a thickness of 2 nm. The thickness of the TaBN layer 310 may be 50-70 nm or 70-80 nm. These are merely respective examples of absorber materials and materials underlying the absorber materials (i.e., underlying materials that are exposed where the absorber material is absent). Other absorber materials and/or underlying materials can also be used in accordance with some embodiments.

Figure 3:
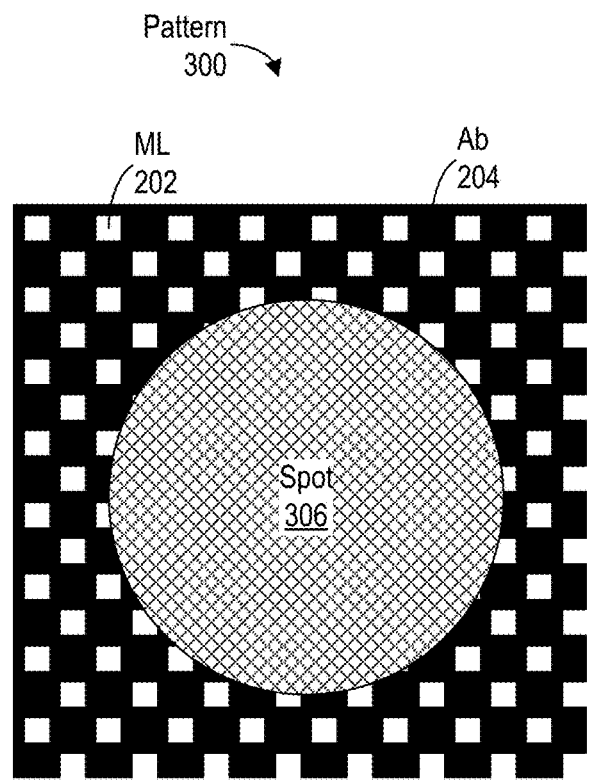
FIG. 3 is a plan view of a pattern on the surface of a photomask, illuminated by a spot of light from a broadband light interferometer, in accordance with some embodiments.

FIG. 3 is a plan view of a pattern 300 on the surface of the photomask 120, illuminated by a spot 306 of light from the broadband light interferometer 100 (FIG. 1), in accordance with some embodiments. The pattern 300 includes regions in which the multilayer material 202 is exposed and regions in which the absorber material 204 covers the multilayer material 202. The pattern 300 is periodic. Focal-mapping techniques described herein do not require periodic patterning, however, and may also be used for photomasks with non-periodic (e.g., random) patterning.

A patterned area, such as the patterned area 200 (FIG. 2) or an area in the pattern 300 (FIG. 3) has a fill factor a equal to the fraction of the area that is not covered by the absorber material 204 (i.e., a is the fill factor for the exposed multilayer material 202). As shown in FIG. 2, $E_{1r}^0$ is the reflected electric field off the absorber material 204 (which is not a perfect absorber, such that $E_{1r}^0$ is non-zero) and $E_{2r}^0$ is the reflected electric field off the multilayer material 202 (which is not a perfect reflector). The zeroth-order diffracted light off of the patterned area 200 is:

$$E_r^0 = (1-\alpha)E_{1r}^0 + \alpha E_{2r}^0 \quad (1)$$

The wavelength-dependent phase factor of $E_r^0$ is:

$$\phi(\lambda) = \phi(E_r^0(\lambda)) \quad (2).$$

Assuming that $w(\lambda)$ is the spectrum of light from the broadband light source 102 (FIG. 1), with $\lambda$ extending across the wavelength band of the light, the measured height (i.e., the effective height obtained through broadband light interferometry, which is different from the actual height) is:

$$h_{eff} = \frac{\int \frac{\lambda}{4\pi}(\phi)(\lambda)w(\lambda)d\lambda}{\int (\lambda)d\lambda} \quad (3)$$

In equation 3, $4\pi$ accounts for the double-pass of the light reflected by the surface of the photomask 120. Manipulating the zeroth-order diffracted light, the following equation is obtained:

$$E_r^0 = (1-a)|E_{1r}^0| + a|E_{2r}^0|\exp\left(i\left(\frac{4\pi t}{\lambda} + \phi_0\right)\right) \quad (4)$$

where t is the height (i.e., thickness) of the absorber material 204 and $\phi_0$ is the sudden phase change difference between reflection of light from the multilayer material 202 and from the absorber material 204.

Figure 4:
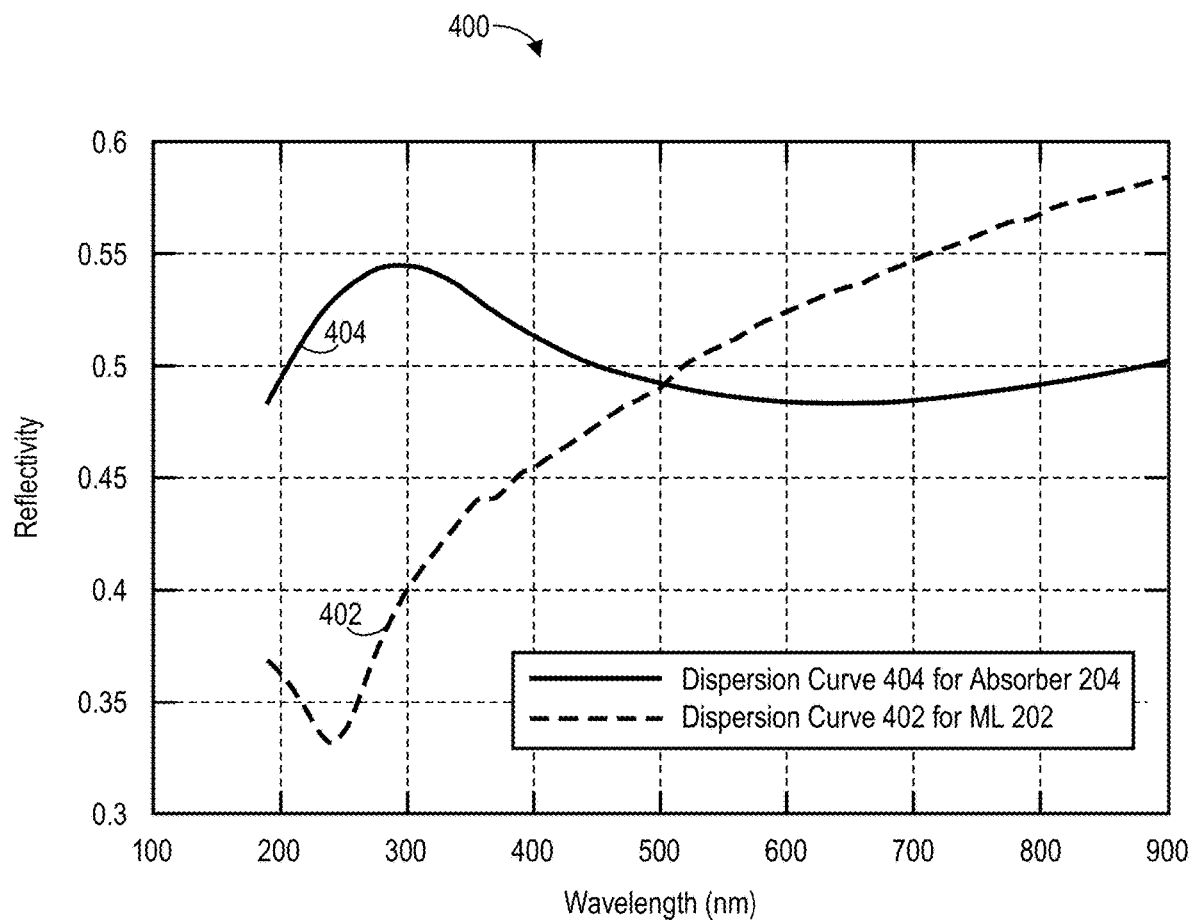
FIG. 4 is a graph showing measured reflectivity dispersion curves for multilayer material and absorber material on the surface of a photomask.

The absorber material 204 and multilayer material 202 are chosen to absorb and reflect light, respectively, at the appropriate photolithographic wavelength (e.g., at 13.5 nm for EUV photolithography). The absorber material 204 and multilayer material 202 are dispersive, however, and their reflectivity varies as a function of wavelength. FIG. 4 is a graph 400 showing measured reflectivity dispersion curves 402 and 404 (i.e., curves showing reflectivity versus wavelength) for the multilayer material 202 and the absorber material 204. In the example of FIG. 4, the multilayer material 202 and absorber material 204 are for 13.5 nm photolithography. The multilayer material 202 includes MoSi bilayers as described above. The absorber material 204 includes TaBN with a TaBO capping layer, as described above.

Figure 5:
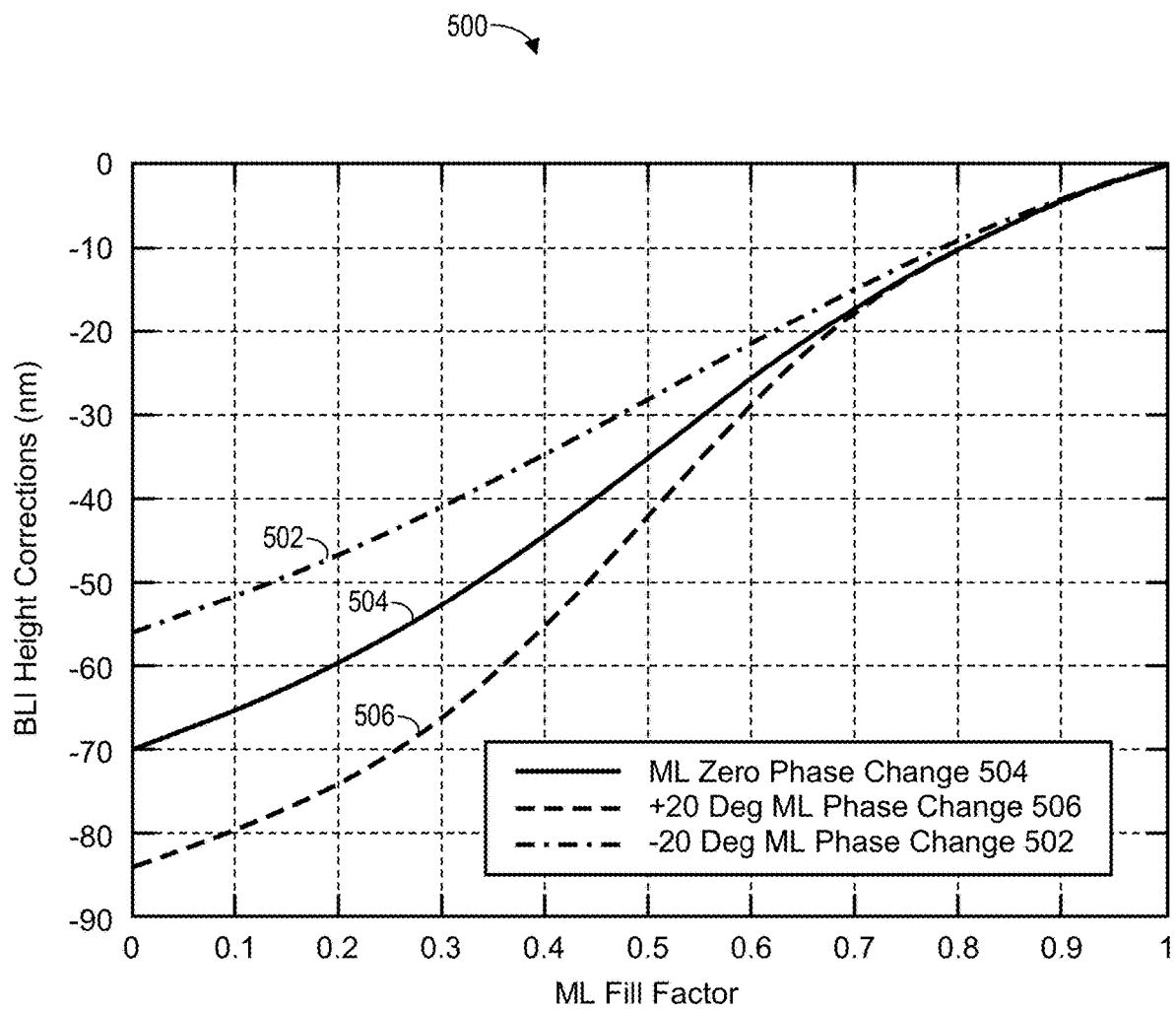
FIG. 5 is a graph showing calculated curves of height correction versus fill factor in accordance with some embodiments.

FIG. 5 is a graph 500 showing calculated height-correction curves in accordance with some embodiments. The height correction curves show height corrections, which are to be applied to measured photomask heights (e.g., photomask heights measured using broadband light interferometry), versus the fill factor a (i.e., the ML 202 fill factor). The height correction curves are calculated in accordance with equations 3 and 4, and vary as a function of the phase change of light upon reflection by the multilayer material 202. FIG. 5 shows a first curve 502 for a phase change of −20°, a second curve 504 for a zero-degree phase change, and a third curve 506 for a phase change of +20°. The actual phase change may be measured offline (e.g., using a calibration photomask), and the height-correction curve for the actual phase change calculated accordingly. In the example of FIG. 5, the height corrections are defined as negative and may be subtracted from the photomask heights measured using broadband light interferometry to provide a focal map that gives a trajectory for focusing the inspection optics (e.g., EUV optics 1334, FIG. 13) on the top of the absorber material 204. The height corrections may alternatively be defined as positive and added to the measured photomask heights. In still other examples, the height corrections may be correction factors by which the measured photomask heights are multiplied or divided. Application of the height corrections may produce a focal map that gives a trajectory for focusing the inspection optics on top of the absorber material 204, on top of the multilayer material 202 (i.e., at the bottom of the absorber material 204), or on any predetermined surface in between or outside of these two surfaces.

Figure 6:
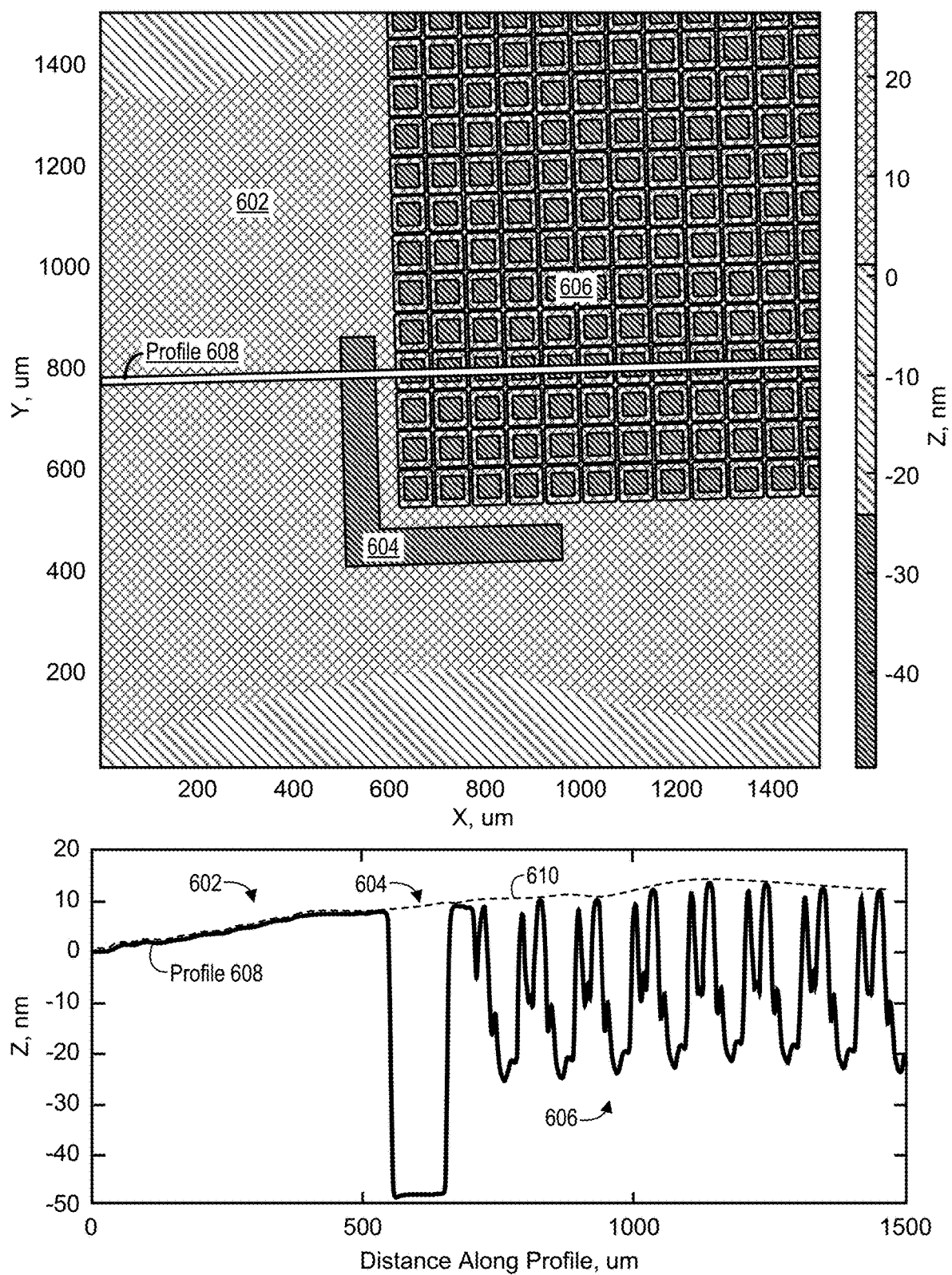
FIG. 6 shows a plan view of a height image of a photomask and a corresponding curve showing heights in a cross-sectional profile of the photomask along with a focal-map trajectory for the cross-sectional profile, in accordance with some embodiments.

FIG. 6 shows a plan view of a height image of a photomask 120 and a corresponding curve showing heights in a cross-sectional profile 608 of the photomask 120, in accordance with some embodiments. The height image is generated using an optical height sensor. For example, the height image is generated by performing broadband light interferometry (e.g., using the broadband light interferometer 100, FIG. 1) to generate interferograms with the objective (e.g., objective 112, FIG. 1) at multiple respective heights (i.e., z-positions) above the photomask 120, and analyzing the interferograms to determine measured heights. In the example of FIG. 6, the photomask 120 includes an unpatterned area 602 in which the multilayer material 202 is covered by absorber material 204, an area 604 (e.g., a target area) in which the absorber material 204 is absent and the multilayer material 202 is exposed, and patterned areas 606 in which portions of the multilayer material 202 are covered by absorber material 202. Ignoring patterning, height variation across the photomask 120 is primarily due to bowing of the photomask 120. For example, the height variation in the unpatterned area 602 is primarily due to bowing. The height (i.e., z-component) of each side of the area 604 corresponds to the height (i.e., thickness) of the absorber material 204. Heights in the patterned areas 606 similarly should step up and down by an amount equal to the height (i.e., thickness) of the absorber material 204, since the absorber material 204 is either present or absent at each point in the patterned areas 606. Broadband light interferometry (or other optical height sensing), however, is not able to resolve the features in the patterned areas 606 (e.g., because the patterning pitch is less than the resolution limit). As a result, the measured heights in the patterned areas 606 include intermediate values, which are incorrect. Raw heights as measured through broadband light interferometry therefore cannot be used for focal mapping. Once height corrections (e.g., the height corrections of FIG. 5) have been applied to the raw heights, then the corrected heights may be used for focal mapping. In FIG. 6, application of the height corrections in the patterned areas 606 for the profile 608 results in a trajectory 610 that can be used for the cross-section of the profile 608 through the patterned areas 606, unpatterned area 602, and/or area 604 in a focal map. The focal map allows the inspection optics (e.g., EUV optics 1334, FIG. 13) to focus on the top of the absorber material 204 during defect inspection. In some embodiments, the focal map may specify focal points that are offset from the top of the absorber material 204 by a specified vertical distance (i.e., z-distance).

To obtain height corrections from a height-correction curve (e.g., one of the curves in FIG. 5), the fill factors for respective photomask areas are first determined. In some embodiments (e.g., for die-to-database inspection), the database of the design for the photomask is available and the fill factors are determined from the database (e.g., as in step 806 of the method 800, FIG. 8).

In other embodiments (e.g., for die-to-die inspection) (e.g., in which the database of the design for the photomask is not available), the fill factors can be determined based on average reflectivities. Each z-position (i.e., z-height) for the objective (or photomask) corresponds to a distinct phase index i. Taking interferograms with the objective at different z-positions corresponds to stepping through phase indices i, where the interferogram intensity is:

$$I_i = a + b \cos(\phi_i + \Delta) \quad (5)$$

where $\Delta$ is the phase (i.e., height) for the sample (i.e., photomask area) of interest, and coefficients a and b are related to the reflected light from the reference surface and the sample (i.e., photomask) surface in the broadband light interferometer. The coefficients a and b may be obtained through known analysis of the interferograms. Having obtained a and b, the ratio $|r_r/r_t|$ of the reference-surface reflectivity $r_r$ and the testing-surface reflectivity $r_t$ (i.e., the sample-surface reflectivity, which is the reflectivity of an area of the photomask surface) is deduced, again through known interferometric analysis. The reference-surface reflectivity $r_r$ is a known property of the broadband light interferometer, and the amplitude (i.e., magnitude) of the testing-surface reflectivity $r_t$ is determined accordingly.

Figure 7:
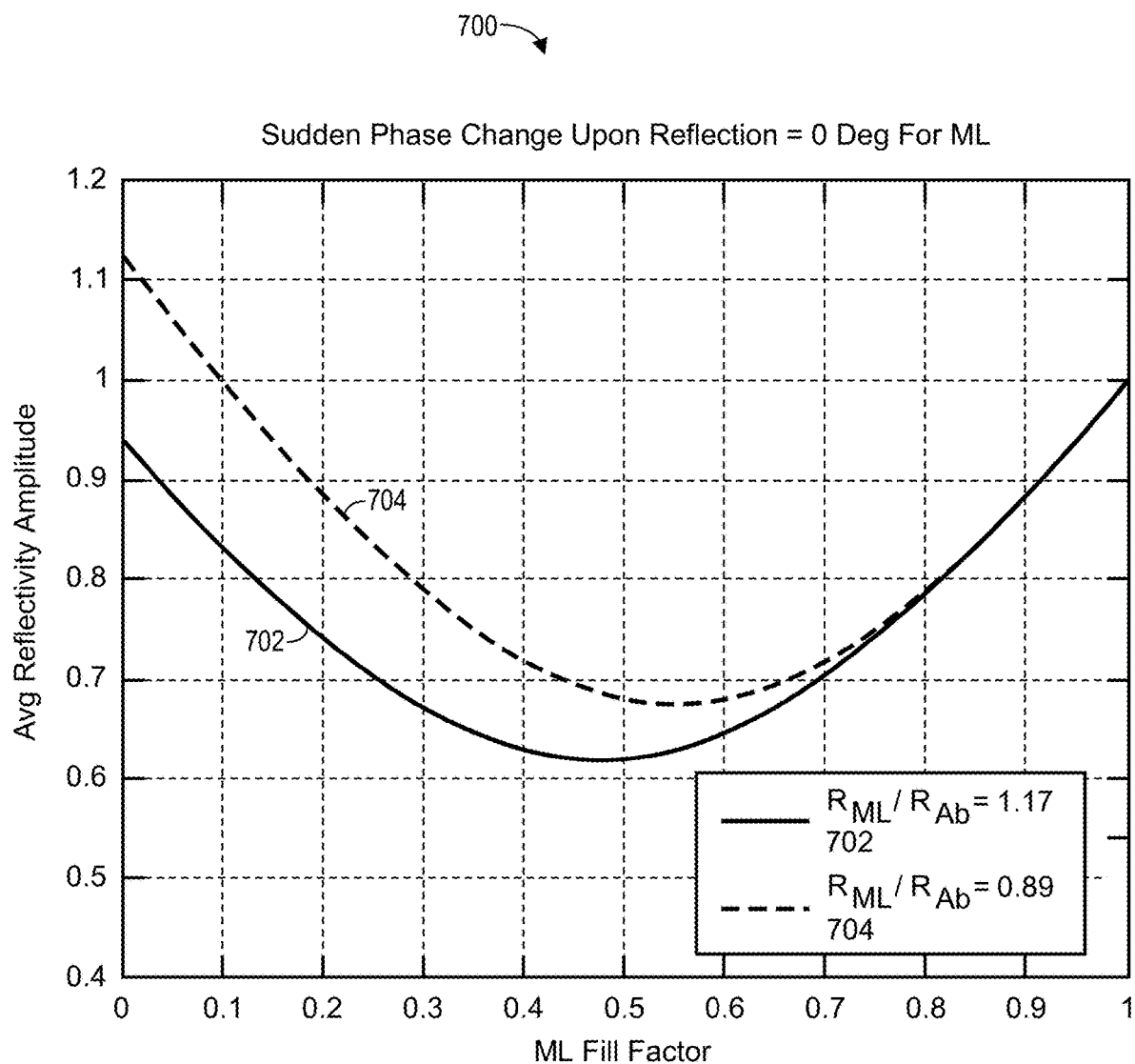
FIG. 7 is a graph showing curves of average reflectivity amplitude versus fill factor for different wavelength bands, in accordance with some embodiments.

FIG. 7 is a graph 700 showing curves of average reflectivity amplitude versus fill factor a (i.e., versus the multilayer-material 202 fill factor) for different wavelength bands (e.g., colors), in accordance with some embodiments. The curves of the graph 700 are calculated and thus prophetic. The curves include a first curve 702 for a first wavelength band in which the ratio of the reflectivity of the multilayer material 202 to the reflectivity of the absorber material 204 is 1.17 (i.e., $R_{ML}/R_{Ab} = 1.17$) and a second curve 704 for a second wavelength band in which the ratio of the reflectivity of the multilayer material 202 to the reflectivity of the absorber material 204 is 0.89 (i.e., $R_{ML}/R_{Ab} = 0.89$). The curves 702 and 704 are calculated assuming a zero-degree phase change upon reflection by the multilayer material 202 (e.g., as for the curve 504, FIG. 5). Similar curves may be calculated for other phase changes.

As the curves 702 and 704 show, the reflectivity for a single wavelength band does not specify a single fill factor: the correlation between reflectivities and fill factors is not one-to-one. In the curves 702 and 704, the correlation between reflectivities and fill factors is one-to-two (i.e., a respective reflectivity value corresponds to two fill factors). Multiple (e.g., two) different wavelength bands (e.g., colors), however, can be used together to determine a unique fill factor for measured reflectivities. For example, the broadband light interferometer 100 may be configured to generate interferograms using each of the two different wavelength bands (e.g., by changing LEDs in the broadband light source 102, changing filters in the broadband light source 102, or multiplexing multiple broadband light sources 102). Given the resulting reflectivity data, unique fill factors may be identified for respective photomask areas, using the curves 702 and 704.

Figure 8:
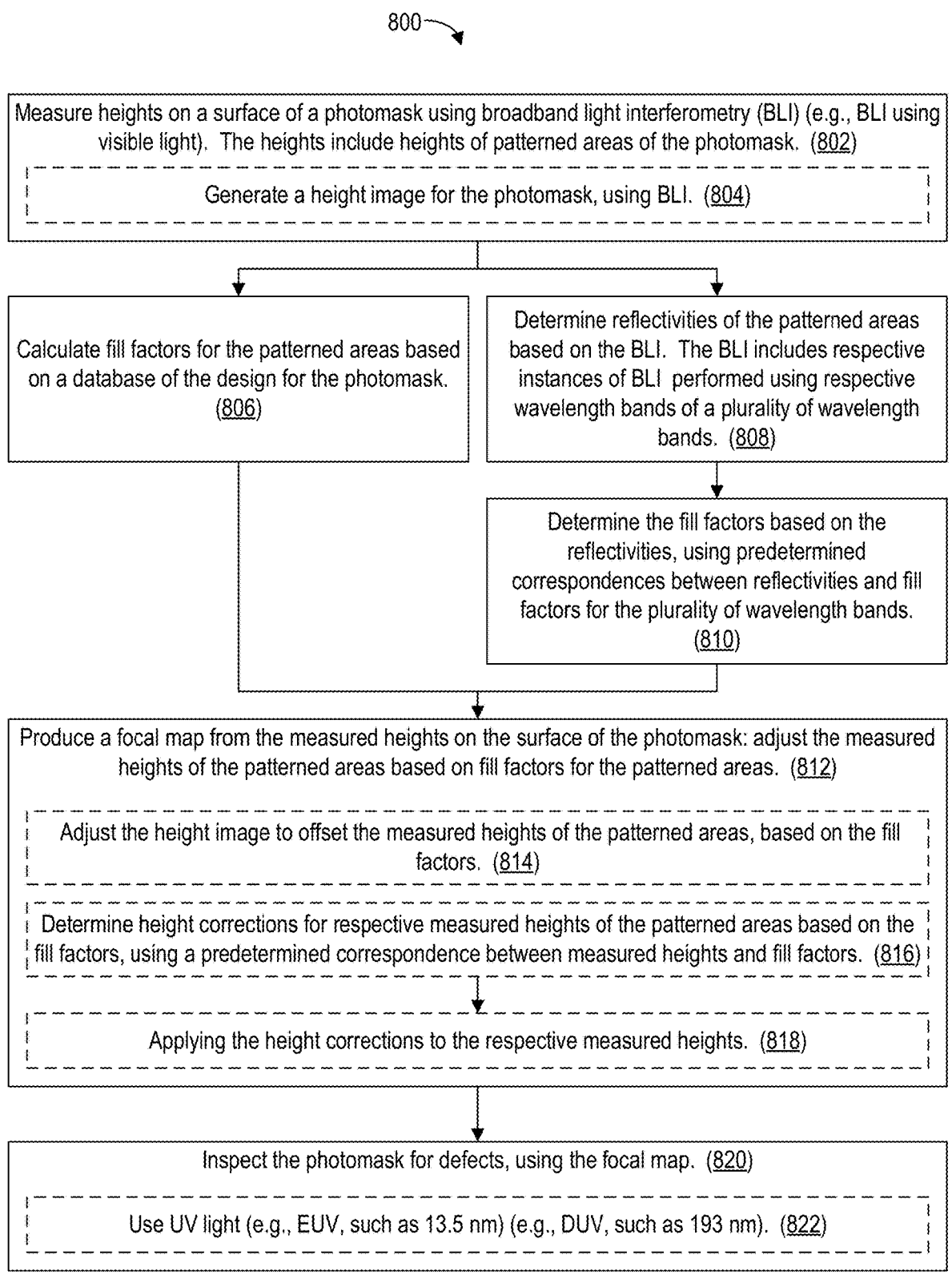
FIG. 8 is a flowchart showing a method for inspecting photomasks, in accordance with some embodiments.

FIG. 8 is a flowchart showing a method 800 for inspecting photomasks, in accordance with some embodiments. The method 800 may be performed by a photomask-inspection system (e.g., photomask-inspection system 1100, FIG. 11; 1300, FIG. 13) that includes a broadband light interferometer (e.g., the broadband light interferometer 100, FIG. 1) (e.g., the broadband light interferometer of FIG. 9 and/or FIGS. 10A-10B). In the method 800, heights on a surface of a photomask (e.g., photomask 120, FIG. 1; 930, FIG. 9; 1030, FIGS. 10A-10B; 1118, FIG. 11) are measured (802) using broadband light interferometry (e.g., using Mirau interferometry or Michelson interferometry). The heights include heights of patterned areas of the photomask (e.g., areas patterned with an absorber material 204 situated above a multilayer material 202, FIGS. 2-3). In some embodiments, the broadband light interferometry uses visible light. In some embodiments, a height image (e.g., as shown in FIG. 6) (e.g., z-height frames 1126, FIG. 11) for the photomask is generated (804) using the broadband light interferometry. The height image may include measured heights for the entire photomask or a portion thereof. For example, the height image may include measured heights for a cross-section of the photomask (e.g., for the profile 608, FIG. 6).

In some embodiments, fill factors (e.g., fill factors a for multilayer material 202) for the patterned areas are calculated (806) based on a database of the design for the photomask. For example, the database is a gds file or includes design data that was provided in a gds file. The design data in the database specifies where absorber material (e.g., absorber material 204, FIG. 2) is present and absent on the photomask, thus allowing fill factors to be calculated. This calculation of fill factors is performed, for example, for die-to-database inspection, in which the subsequent defect inspection of step 820 involves comparing results from inspecting the photomask to results from simulated inspection of the design in the database.

Figure 11:
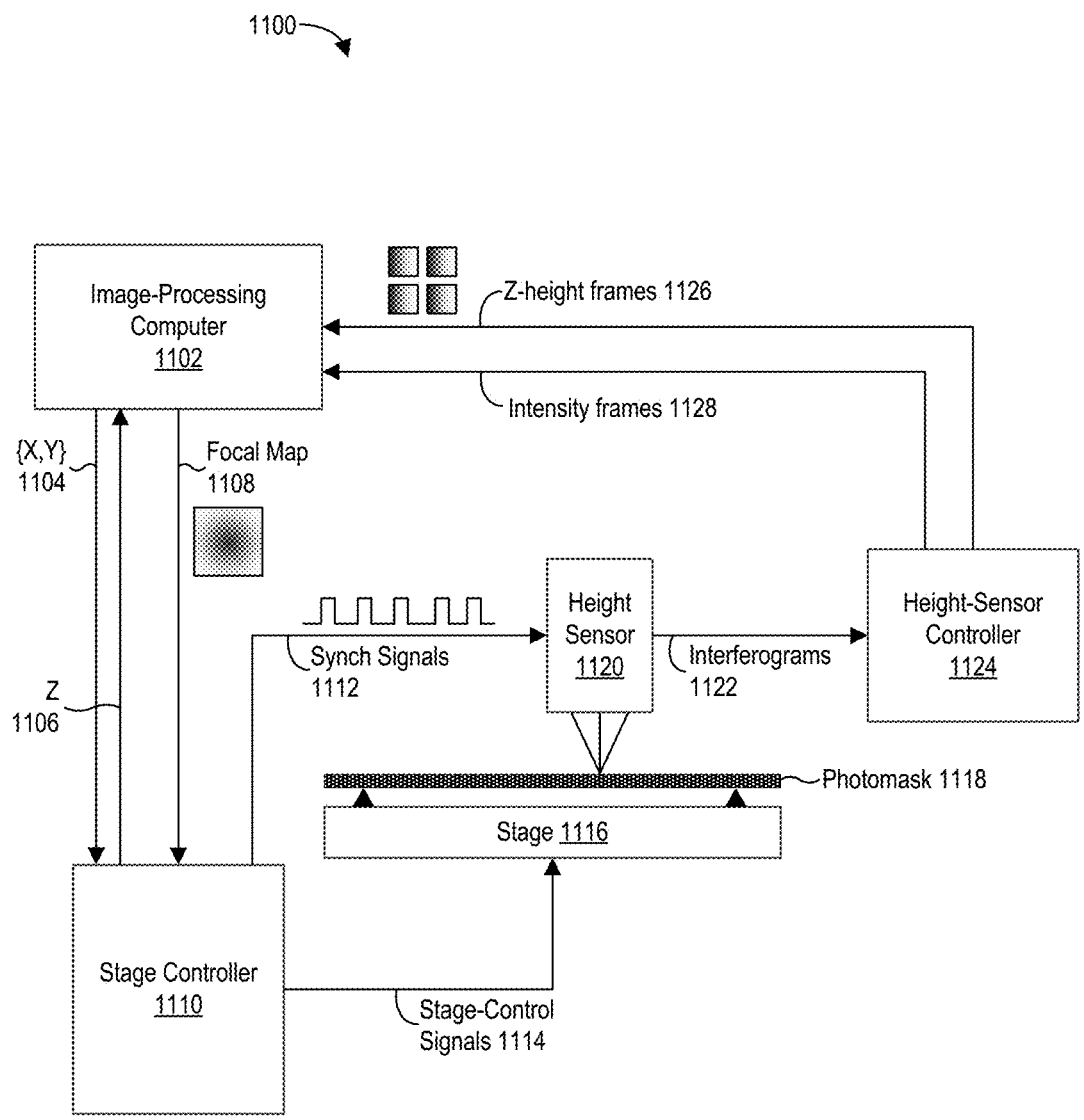
FIG. 11 is a schematic block diagram of a photomask-inspection system that includes an image-processing computer, height-sensor controller, and stage controller, in accordance with some embodiments.

Fill factors (e.g., fill factors a for multilayer material 202) may alternatively be determined without using a database of the photomask design. In some embodiments, reflectivities (e.g., average reflectivities) of the patterned areas are determined (808) based on the broadband light interferometry (e.g., in accordance with equation 5). The broadband light interferometry includes respective instances of broadband light interferometry performed using respective wavelength bands (e.g., colors) of a plurality of wavelength bands (e.g., two wavelength bands), and the reflectivities are determined for each of the respective wavelength bands. The reflectivities may be specified in intensity frames 1128 (FIG. 11). The fill factors are determined (810) based on the reflectivities, using predetermined correspondences between reflectivities and fill factors for the plurality of wavelength bands (e.g., correspondences that are not one-to-one). For example, the fill factors are determined using correspondences like those shown in FIG. 7. The plurality of wavelength bands may include a first color and a second color. The predetermined correspondences may include a first correspondence between reflectivities and fill factors for the first color and a second correspondence between reflectivities and fill factors for the second color, with neither the first correspondence nor the second correspondence being one-to-one. This determination of fill factors based on reflectivities is performed, for example, for die-to-die inspection, in which the subsequent defect inspection of step 820 involves comparing results from inspecting a die area on the photomask to results from inspecting a reference photomask die area.

A focal map (e.g., focal map 1108, FIG. 11) is produced (812) from the measured heights on the surface of the photomask. Producing the focal map includes adjusting the measured heights of the patterned areas based on fill factors for the patterned areas. In some embodiments, the height image is adjusted (814) to offset the measured heights of the patterned areas (e.g., including measured heights in a cross-section of the photomask, such as the cross-section for the profile 608, FIG. 6), based on the fill factors. Height corrections for respective measured heights of the patterned areas may be determined (816) based on the fill factors, using a predetermined correspondence between measured heights and fill factors (e.g., using a correspondence like those shown in FIG. 5). The height corrections may be applied (818) to the respective measured heights (e.g., to produce a trajectory 610, FIG. 6). The resulting focal map may be substantially pattern-independent (e.g., such that the light used for photomask inspection in step 820 is focused on the top of absorber material 204, on top of the multilayer material 202, or on any predetermined surface in between or outside of these two surfaces).

The photomask is inspected (820) for defects, using the focal map (i.e., the photomask-inspection optics focus the light used to inspect the photomask in accordance with the focal map). In some embodiments, ultraviolet (UV) light is used (822) to inspect the photomask. For example, extreme ultraviolet (EUV) (e.g., 13.5 nm) light is used. EUV is a common, well-known and well-understood technical term that refers to light with wavelengths in the range of 124 nm down to 10 nm. By using the focal map during inspection, the EUV focal plane will follow the focal map. The focal map may be pattern-independent.

Attention is now directed to systems for photomask inspection. The EUV optics used to inspect a photomask for defects include an EUV objective that may be disposed in a vacuum chamber. At least part of an optical height sensor that is used to produce a focal map for inspecting the photomask is also disposed in the vacuum chamber. The optical height sensor is situated off-axis from the EUV objective, such that the optic axis for EUV light in the EUV objective is distinct from the optic axis for the light in the optical image sensor. Examples of the optical height sensor include an interferometer (e.g., a broadband light interferometer, which is also referred to as a white light interferometer), chromatic confocal sensor, laser-triangulation sensor, or structured-light sensor.

Figure 9:
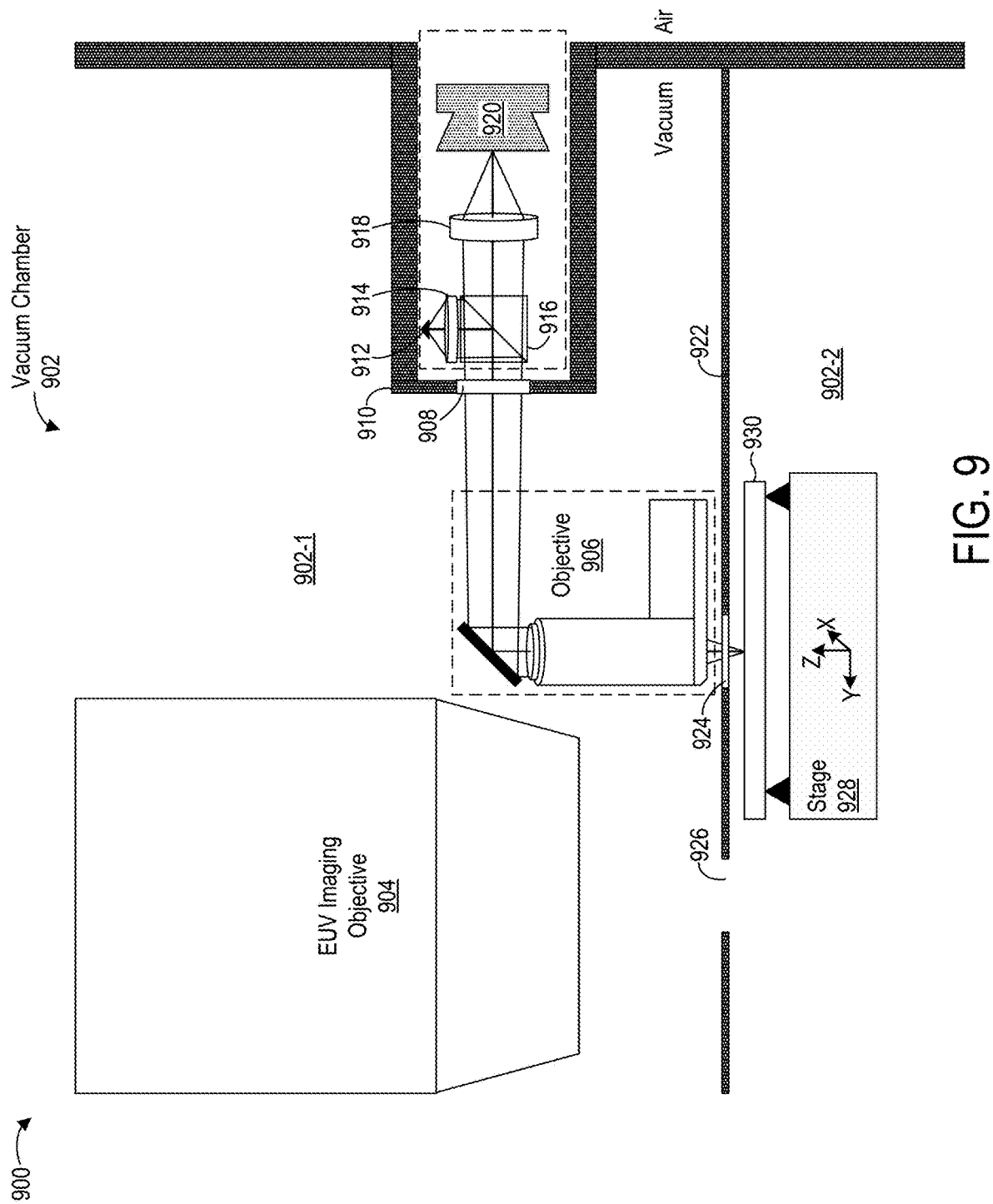
FIG. 9 is a schematic block diagram of a photomask-inspection tool in accordance with some embodiments.

FIG. 9 is a schematic block diagram of a photomask-inspection tool 900 in accordance with some embodiments. The tool 900 includes a vacuum chamber 902. Disposed in the vacuum chamber 902 are an EUV imaging objective 904 (also referred to as an EUV objective 904), an objective 906, and a stage 928. The stage 928 supports a photomask 930 for inspection and translates the photomask 930 both horizontally (i.e., in the x-y plane) and vertically (i.e., in the z-direction, both up and down). The photomask 930 is loaded onto the stage 928 in the vacuum chamber 902 for inspection and then unloaded and removed from the vacuum chamber 902 once inspection is complete. The EUV objective 904 collects EUV light (e.g., 13.5 nm light) from the photomask 930 during inspection of the photomask 930 for defects. The EUV objective 904 provides the collected EUV light to EUV-sensitive sensors (not shown). The objective 906, which may be infinity-conjugated, is part of an optical height sensor that is used to measure heights on a surface of the photomask 930. The optical height sensor uses light that is not EUV and that has wavelengths longer than EUV light. For example, the optical height sensor may use infrared, visible, and/or ultraviolet (but not EUV) light. The focal map for inspecting the photomask is produced using the measured heights (e.g., per step 812 of the method 800, FIG. 8; per step 1216 of the method 1200, FIG. 12). The objective 906 is situated off-axis from the EUV objective 904. The stage 928 may have sufficient travel to allow both the EUV objective 904 and the objective 906 to view the entire surface of the photomask 930, with the respective fields of view for both the EUV objective 904 and the objective 906 being smaller than the surface of the photomask 930.

In some embodiments, the vacuum chamber 902 includes a plate 922 that divides the vacuum chamber 902 into a first sub-chamber 902-1 and a second sub-chamber 902-2. The EUV objective 904 and the objective 906 are disposed in the first sub-chamber 902-1. The stage 928 is disposed in the second sub-chamber 902-2. The stage 928 is a source of contamination in the vacuum of the second sub-chamber 902-2; the plate 922 blocks this contamination from entering the first sub-chamber 902-1 and thus from contaminating the EUV objective 904 and the objective 906. The plate 922 has a window 924 to allow light to pass between the objective 906 and the photomask 930. The plate 922 also has a hole 926 to allow EUV light to pass between the photomask 930 and the EUV objective 904. To measure heights in an area on the surface of the photomask 930, the stage 928 is translated to position the area beneath the window 924. To inspect an area of the surface of the photomask 930 for defects, the stage 928 is translated to position the area beneath the window 924. The first sub-chamber 902-1 and second sub-chamber 902-2 may be pumped separately using differential pumping: one or more first vacuum pumps may be used to pump the first sub-chamber 902-1 while one or more second vacuum pumps are used to pump the second sub-chamber 902-2. In some embodiments, the objective 906 is sealed (e.g., enclosed in a sealed assembly) to reduce contamination from optical components and mounts.

In some embodiments, the objective 906 is an interferometric objective that is part of a broadband light interferometer (i.e., white light interferometer). In FIG. 9, the objective 906 is shown as an objective for a Michelson interferometer. Alternatively, the objective 906 may be a Mirau interferometer. The optical height sensor thus is (or includes) the broadband light interferometer (e.g., a Michelson interferometer or a Mirau interferometer). Additional components of the broadband light interferometer, including a broadband light source 912 (e.g., broadband light source 102, FIG. 1), condenser lens 914, beam splitter 916, tube lens 918, and image sensor 920, are disposed outside of the vacuum chamber 902. (All active components of the height sensor, including for example the broadband light source 912 and the image sensor 920, are disposed outside of the vacuum chamber 902, while passive components of the height sensor are disposed both inside and outside of the vacuum chamber 902, in accordance with some embodiments. The in-vacuum optics for the height sensor thus may be entirely passive.) The broadband light source 912 provides light with a band of wavelengths (e.g., with a 50 nm bandwidth), which is directed by the condenser lens 914 onto the beam splitter 916. The beam splitter 916 directs this light through a window 908 in an exterior wall 910 of the vacuum chamber 902 (e.g., of the first sub-chamber 902-1) to the objective 906. The objective 906 directs some of this light through the window 924 to the photomask 930, reflects some of this light internally as reference light, and collects light from the photomask 930. The light collected from the photomask interferes with the reference light. The combination of light collected from the photomask 930 and the reference light is directed by the objective 906 through the window 908 and beam splitter 916 to a tube lens 918, which focuses the light onto an image sensor 920. The light received by the image sensor 920 produces interferograms that are captured as images by the image sensor 920. For a given x-y (i.e., horizontal) position of the stage 928, and thus for a corresponding area on the surface of the photomask 930, interferograms are collected at multiple respective z-heights of the stage 928, and thus for multiple respective distances between the surface of the photomask 930 and the objective 906. These interferograms are used to measure heights on the surface of the photomask 930 (e.g., per step 802 of the method 800, FIG. 8).

Figure 10A:
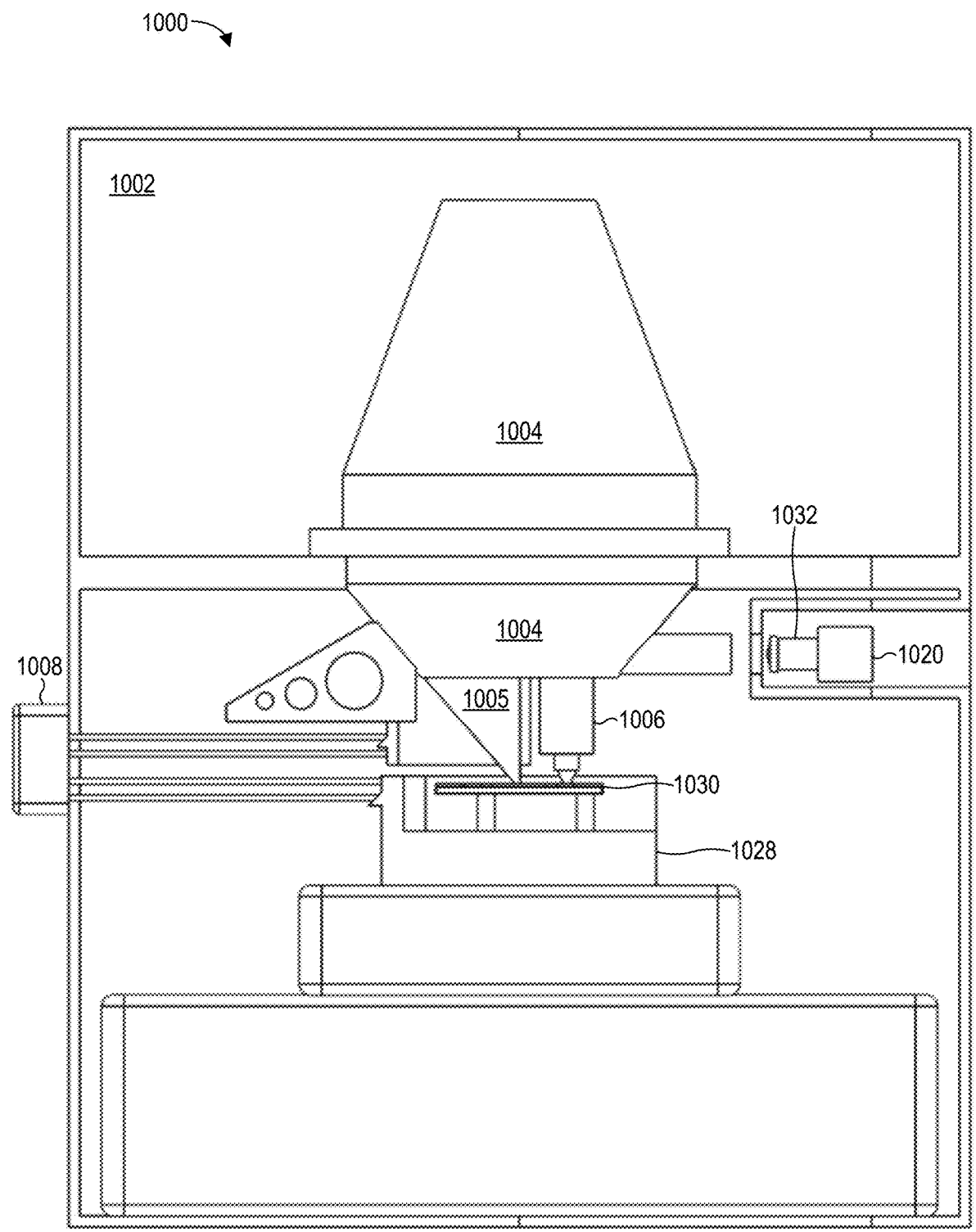
FIGS. 10A and 10B are respective side and perspective views of a photomask-inspection tool in accordance with some embodiments.
Figure 10B:
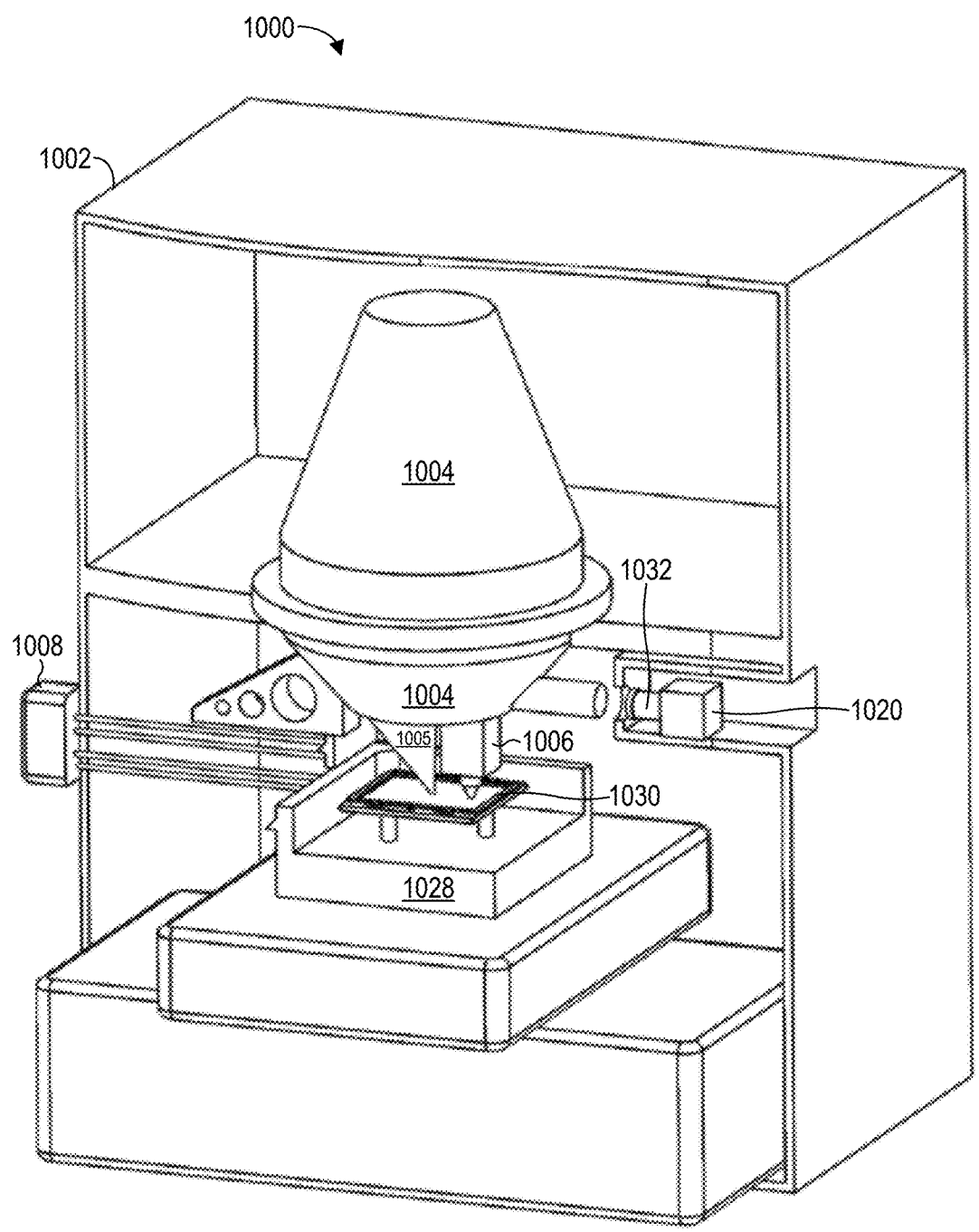

FIGS. 10A and 10B are respective side and perspective views of a photomask-inspection tool 1000 in accordance with some embodiments. The tool 1000 is an example of the photomask-inspection tool 900 (FIG. 9). The tool 1000 includes a vacuum chamber 1002 (e.g., vacuum chamber 902, FIG. 9). An EUV objective 1004 (e.g., EUV objective 904, FIG. 9), interferometric objective 1006 (e.g., objective 906, FIG. 9), and stage 1028 (e.g., stage 928, FIG. 9) are disposed in the vacuum chamber 1002. The stage 1028 supports and translates a photomask 1030 (e.g., photomask 930, FIG. 9). In some embodiments, the tool 1000 has a plate such as the plate 922 (FIG. 9); the plate is not shown in FIGS. 10A and 10B to avoid obscuring other components. The tool 1000 may also include a mirror set 1005 that directs EUV light from an EUV light source to the photomask 1030. The mirror set 1005 illuminates the photomask 1030 with EUV light, while the EUV objective 1004 collects EUV light from the photomask 1030.

In some embodiments, the interferometric objective 1006, which is situated off-axis from the EUV objective 1004, is mechanically coupled to the EUV objective 1004. For example, the interferometric objective 1006 is connected to a bottom surface of the interferometric objective 1006 that faces the stage 1028 (e.g., that faces the stage 1028 through a plate, not shown). The interferometric objective 1006 may be an appendage of the EUV objective 1004.

The interferometric objective 1006 is part of a broadband light interferometer that serves as an optical height sensor. The broadband light interferometer also includes an image sensor 1020 (e.g., image sensor 920, FIG. 9) and other optics 1032. The optics 1032 may include the broadband light source 912, condenser lens 914, beam splitter 916, and tube lens 918 (FIG. 9).

FIG. 11 is a schematic block diagram of a photomask-inspection system 1100 that includes an image-processing computer 1102, optical height sensor 1120, height-sensor controller 1124, and stage controller 1110, in accordance with some embodiments. In some embodiments, the optical height sensor 1120 is the broadband light interferometer of the tool 900 (FIG. 9) and/or the tool 1000 (FIGS. 10A-10B). In some embodiments, the optical height sensor 1120 is the broadband light interferometer 100 (FIG. 1).

The stage controller 1110 controls a stage 1116 (e.g., stage 928, FIG. 9; 1028, FIGS. 10A-10B), which is situated in a photomask-inspection tool (e.g., photomask-inspection tool 900, FIG. 9; 1000, FIGS. 10A-10B). The stage 1116 supports and translates a photomask 1118 (e.g., photomask 930, FIG. 9; photomask 1030, FIGS. 10A-10B). The stage controller 1110 controls the stage 1116 by sending stage-control signals 1114 to the stage 1116. The stage-control signals 1114 instruct the stage 1116 to translate horizontally and vertically. In this manner, the stage controller 1110 horizontally and vertically translates the stage 1116 (i.e., causes the stage 1116 to translate horizontally and vertically), and thereby causes the stage 1116 to horizontally and vertically translate the photomask 1118.

During defect inspection of the photomask 1118, the stage controller 1110 translates the stage 1116 horizontally and vertically in accordance with a focal map 1108 (which may also be referred to as a height map). The image-processing computer 1102 provides the focal map 1108 to the stage controller 1110. The focal map 1108 specifies respective z-heights at which EUV light used to inspect the photomask 1118 is to be focused for respective x- and y-coordinates of the photomask 1118 (e.g., as described for FIG. 6). For example, the focal map 1108 specifies trajectories 610 for respective profiles 608 (FIG. 6) of the photomask 1118. The stage controller 1110 translates the stage 1116 in accordance with the focal map 1108, to achieve the desired focus (or as close to the desired focus as the control system for the stage 1116 can achieve). In some embodiments, the stage controller 1110 controls the stage 1116 using closed-loop control. For example, the stage 1116 has mirrored sides. Interferometers (e.g., interferometers 1008, FIGS. 10A-10B) determine the location of the stage 1116 by shining light on the mirrored sides and provide feedback to the stage controller 1110 indicating the location of the stage 1116. (The interferometers are distinct from the optical height sensor 1120). The stage controller 1110 sends stage-control signals 1114 to the stage 1116 to adjust the position of the stage 1116 based on this feedback as well as on the focal map 1108.

The optical height sensor 1120, height-sensor controller 1124, and image-processing computer 1102 are used to produce the focal map 1108. The image-processing computer 1102 specifies x-y coordinates 1104 of areas on the surface of the photomask 1118 at which heights (including heights of patterned areas) are to be measured. The x-y coordinates 1104 are transmitted from the image-processing computer 1102 to the stage controller 1110. The stage controller 1110 translates the stage 1116 to a specified x-y coordinate and then translates the stage through a series of z-heights 1106 (i.e., scans through z-heights 1106). The stage controller 1110 performs this translation by transmitting corresponding stage-control signals 1114 to the stage 1116. The optical height sensor 1120 generates interferograms 1122 at each of the z-heights 1106 and transmits the interferograms to the height-sensor controller 1124. The stage controller 1110 sends synchronization ("synch") signals 1112 to the optical height sensor 1120 to control operation of the optical height sensor 1120. The synch signals 1112 may indicate (e.g., may include pulses that indicate) when the optical height sensor 1120 is to generate interferograms 1122 (e.g., that indicate when the stage 1116 has reached specified x-y coordinates). For example, the synch signals 1112 may include trigger signals that cause the optical height sensor 1120 to start acquisition of interferograms 1122. The synch signals 1112 may provide information corresponding to the vertical (i.e., z-direction) translation of the stage 1116 and the photomask 1118 (e.g., may specify the z-heights 1106). This information may be forwarded by the optical height sensor 1120 to the height-sensor controller 1124, or alternatively transmitted directly from the stage controller 1110 to the height-sensor controller 1124.

The height-sensor controller 1124 analyzes data for the interferograms 1122 (e.g., using the information corresponding to the vertical translation of the stage 1116 and the photomask 1118) to determine heights of patterned areas on the photomask 1118. These heights are uncorrected heights, as shown for example in FIG. 6 for the patterned areas 606. For example, the height-sensor controller 1124 generates z-height frames 1126 that specify uncorrected heights in respective areas of the photomask 1118. Each z-height frame 1126 may be for a respective area on the surface of the photomask 1118 (e.g., a respective area within the field of view of the optical height sensor 1120). The field of view for each z-height frame 1126 is smaller than the surface of the photomask 1118. The z-height frames 1126 may cover the entire surface of the photomask 1118 (e.g., with overlap to allow for stitching during production of the focal map 1108). Alternatively, the z-height frames 1126 may sample the surface of the photomask 1118; for example, the z-height frames 1126 are for respective disconnected areas (e.g., fields of view) on the surface of the photomask 1118. The height-sensor controller 1124 transmits the z-height frames 1126 (or more generally, the uncorrected heights) to the image-processing computer 1102.

The image-processing computer 1102 corrects the uncorrected heights of the patterned areas. Correcting the uncorrected heights includes adjusting the uncorrected heights of the patterned areas based on fill factors for the patterned areas (e.g., per step 812 of the method 800, FIG. 8). In some embodiments, correcting the uncorrected heights also includes applying a height offset (i.e., a z-height offset) to the adjusted heights. The height offset accounts for the height difference between the adjusted heights as determined using the height sensor 1120 and the desired (e.g., best) focal position of the EUV objective (e.g., EUV objective 904, FIG. 9; 1004, FIGS. 10A-10B). The height offset may vary for different locations of the stage 1116. The height offset for different locations of the stage 1116 may be stored in a calibration height-offset map. The calibration height-offset map is sometimes referred to as a base map and the height offset as a base-map offset or base-map correction. Variation of the height offset with stage location results from the stage interferometers (e.g., interferometers 1008, FIGS. 10A-10B) and associated stage mirrors. For different locations of the stage 1116 and thus of the photomask 1118, the stage interferometers will be measuring different areas of the interferometer mirrors. Imperfections in the mirrors and the mounting angles of the mirrors will cause error in the absolute height positions of the height-sensor and EUV-objective field-of-view locations, resulting in location-dependent variation of the height offset.

The calibration height-offset map (i.e., base map) may be generated using a calibration photomask with a grid of fixed patterns printed at known locations (e.g., covering the entire calibration photomask). The calibration photomask is loaded onto the stage 1116. For each location, the z-location of the calibration photomask is measured using the height sensor 1120. The focal positions (e.g., best focal positions) for the EUV objective are measured at the same locations, by capturing multiple frames of EUV images of the patterns at various foci to determine the desired (e.g., best) focused image. The height offsets are determined for the locations based on the respective z-locations and focal positions, which establish the relationship between measured mask topology and EUV focal position at the photomask locations. Through interpolation, the height offset can be obtained for any stage location.

The image-processing computer 1102 generates the focal map 1108 using the corrected heights (e.g., per step 812 of the method 800, FIG. 8). For example, the image-processing computer 1102 stitches together corrected heights for multiple z-height frames 1126. To generate the focal map 1108, the image-processing computer 1102 may also filter and smooth the corrected heights to reduce noise, reject outlier datapoints, and perform image-calibration corrections.

The focal map 1108 may be a map of the entire surface of the photomask 1118 or the area on the photomask 1118 to be inspected for defects (i.e., the inspection area). Alternatively, the focal map 1108 may be a map of a subsection of the inspection area that is inspected for defects using EUV imaging before production of another focal map 1108 of another subsection of the inspection area, which is then inspected for defects, with focal-map production and inspection being performed for respective subsections in an ongoing manner. The focal map 1108 may be down-sampled to a lower spatial resolution before being provided to the stage controller 1110. The focal map 1108 may be converted (e.g., by the stage controller 1110) into a stage trajectory (e.g., trajectory 610, FIG. 6) for every EUV imaging swath across the photomask 1118. For example, the stage trajectory is generated from the data of the focal map 1108 using least-squares global polynomial fitting and spline interpolation between measured points (i.e., between the measured heights of respective locations). The stage trajectories are used to inspect the EUV imaging swaths for defects.

The height-sensor controller 1124 may also generate intensity frames 1128 and send the intensity frames 1128 to the image-processing computer 1102. The intensity frames 1128 may specify reflectivities for respective areas on the surface of the photomask 1118 (e.g., per step 808 of the method 800, FIG. 8). The image-processing computer 1102 may use the intensity frames 1128 to determine fill factors (e.g., per step 810 of the method 800, FIG. 8).

Figure 12:
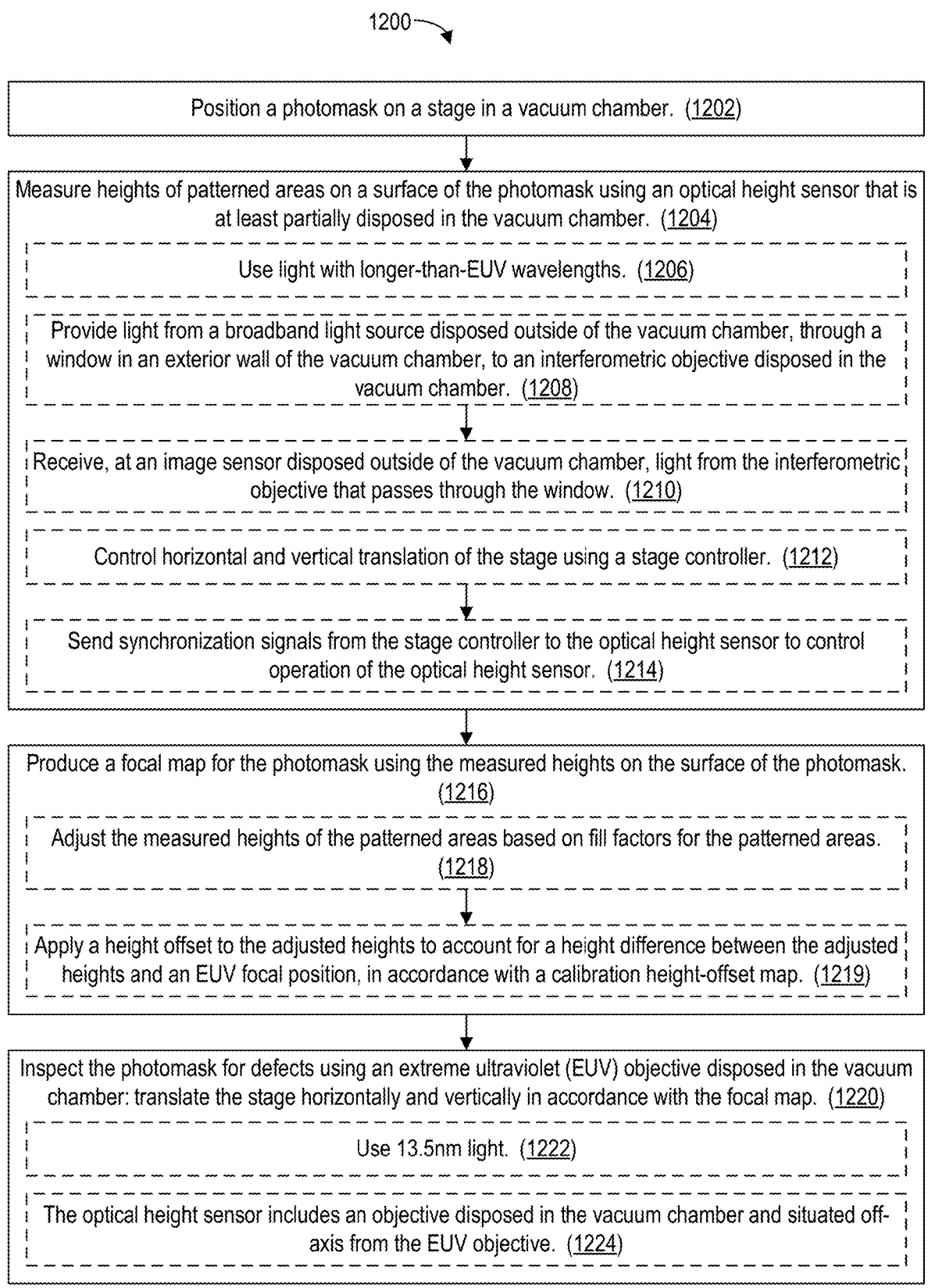
FIG. 12 is a flowchart showing a method for inspecting photomasks in accordance with some embodiments.

FIG. 12 is a flowchart showing a method 1200 for inspecting photomasks, in accordance with some embodiments. The method 1200 may be performed by a photomask-inspection system (e.g., photomask-inspection system 1100, FIG. 11; 1300, FIG. 13). The method 1200 may be an example of the method 800 or portions thereof.

In the method 1200, a photomask (i.e., reticle) is positioned (1202) on a stage (e.g., stage 928, FIG. 9; 1028, FIGS. 10A-10B; 1116, FIG. 11; 1336, FIG. 13) in a vacuum chamber (e.g., vacuum chamber 902, FIG. 9; 1002, FIGS. 10A-10B). Heights of patterned areas on a surface of the photomask are measured (1204) using an optical height sensor (e.g., the broadband light interferometer of FIGS. 1, 9, and/or 10A-10B; 1332, FIG. 13) that is at least partially disposed in the vacuum chamber. The heights may be measured using (1206) light with wavelengths that are longer than for EUV (e.g., using infrared, visible, and/or ultraviolet but not EUV light).

In some embodiments, light from a broadband light source (e.g., broadband light source 102, FIG. 1; 912, FIG. 9) disposed outside of the vacuum chamber is provided (1208) through a window (e.g., window 908, FIG. 9) in an exterior wall of the vacuum chamber to an interferometric objective (e.g., objective 906, FIG. 9; 1006, FIGS. 10A-10B) disposed in the vacuum chamber. Light from the interferometric objective passes through the window and is received (1210) at an image sensor (e.g., camera 106, FIG. 1; image sensor 920, FIG. 9; image sensor 1020, FIGS. 10A-10B) disposed outside of the vacuum chamber.

For example, the vacuum chamber includes a plate (e.g., plate 922, FIG. 9) that divides the vacuum chamber into a first sub-chamber and a second sub-chamber (e.g., first sub-chamber 902-1 and second sub-chamber 902-2, FIG. 9). The interferometric objective is disposed in the first sub-chamber and the stage is disposed in the second sub-chamber. The photomask is illuminated with light from the interferometric objective through a window (e.g., window 924, FIG. 9) in the plate.

In some embodiments, horizontal and vertical translation of the stage is controlled (1212) using a stage controller (e.g., stage controller 1110, FIG. 11). Synchronization signals (e.g., synch signals 1112, FIG. 11) are sent (1214) from the stage controller to the optical height sensor to control operation of the optical height sensor. The synchronization signals may provide information corresponding to the vertical translation of the photomask.

In some embodiments, data is transmitted from the optical height sensor to a height-sensor controller (e.g., height-sensor controller 1124, FIG. 11). The height-sensor controller determines uncorrected heights of patterned areas on the photomask based on the data from the optical height sensor. For example, the height-sensor controller generates z-height frames 1126 (FIG. 11).

A focal map (e.g., focal map 1108, FIG. 11) for the photomask is produced (1216) using the measured heights on the surface of the photomask. Producing the focal map may include adjusting (1218) the measured heights of the patterned areas based on fill factors for the patterned areas (e.g., per step 812 of the method 800, FIG. 8). Producing the focal map may further include applying (1219) a height offset to the adjusted heights to account for a height difference between the adjusted heights and an EUV focal position, in accordance with a calibration height-offset map (i.e., a base map). The method 1200 may further include (e.g., before step 1202) generating the calibration height-offset map using a calibration photomask with a grid of fixed patterns at known locations (e.g., as described for the system 1100, FIG. 11).

In some embodiments, the height-sensor controller transmits the uncorrected heights to an image-processing computer (e.g., image-processing computer 1102, FIG. 11). The image-processing computer corrects the uncorrected heights of the patterned areas, which includes adjusting the uncorrected heights of the patterned areas based on the fill factors for the patterned areas. The image-processing computer generates the focal map using the corrected heights of the patterned areas.

The photomask is inspected (1220) for defects using an extreme ultraviolet (EUV) objective (e.g., EUV objective 904, FIG. 9; 1004, FIGS. 10A-10B) disposed in the vacuum chamber (e.g., in the first sub-chamber). The EUV objective collects EUV light from the photomask and provides the EUV light to EUV-sensitive sensors, which image the photomask. The photomask is thus inspected using EUV light. (Accordingly, measuring the heights of the patterned areas in step 1204 may be performed using light that is not EUV and has wavelengths longer than the EUV light used to inspect the photomask.) For example, the photomask is inspected (1222) using 13.5 nm light. The photomask may be illuminated with EUV light from the EUV objective through a hole in the plate (e.g., hole 926, FIG. 9). The EUV light collected by the EUV objective passes from the photomask through the hole to the EUV objective. To inspect the photomask, the stage is translated horizontally and vertically in accordance with the focal map.

In some embodiments, the optical height sensor includes (1224) an objective (e.g., objective 906, FIG. 9; 1006, FIGS. 10A-10B) disposed in the vacuum chamber and situated off-axis from the EUV objective.

During inspection of the photomask in step 1220, the photomask surface may be subject to deformation or drift over time, causing the focal map to become inaccurate. Inspection of the photomask may be paused (e.g., periodically) and steps 1204 and 1216 may be repeated to produce an updated focal map that accounts for the deformation and/or drift. In some embodiments, the updated focal map is for uninspected areas of the photomask surface. Inspection of the photomask in step 1220 then resumes using the updated focal map: to inspect uninspected areas of the photomask, the stage is translated horizontally and vertically in accordance with the updated focal map. In some embodiments, pausing the inspection of the photomask and repeating steps 1204 and 1216 to produce an updated focal map is performed periodically.

In addition to deformation and/or drift of the photomask surface, the height difference between the adjusted heights and the desired (e.g., best) focal position of the EUV objective may change due to drift of the optical elements. To account for this drift, inspection of the photomask may be paused (e.g., periodically) and the height offset may be refreshed. The height offset may be refreshed by unloading the photomask being inspected, loading the calibration photomask onto the stage, and regenerating the calibration height-offset map using the calibration photomask. The calibration photomask is then unloaded, the photomask being inspected is reloaded onto the stage, steps 1204 and 1216 are repeated to produce an updated focal map using the refreshed height offset, and inspection of the photomask resumes using the updated focal map.

Figure 13:
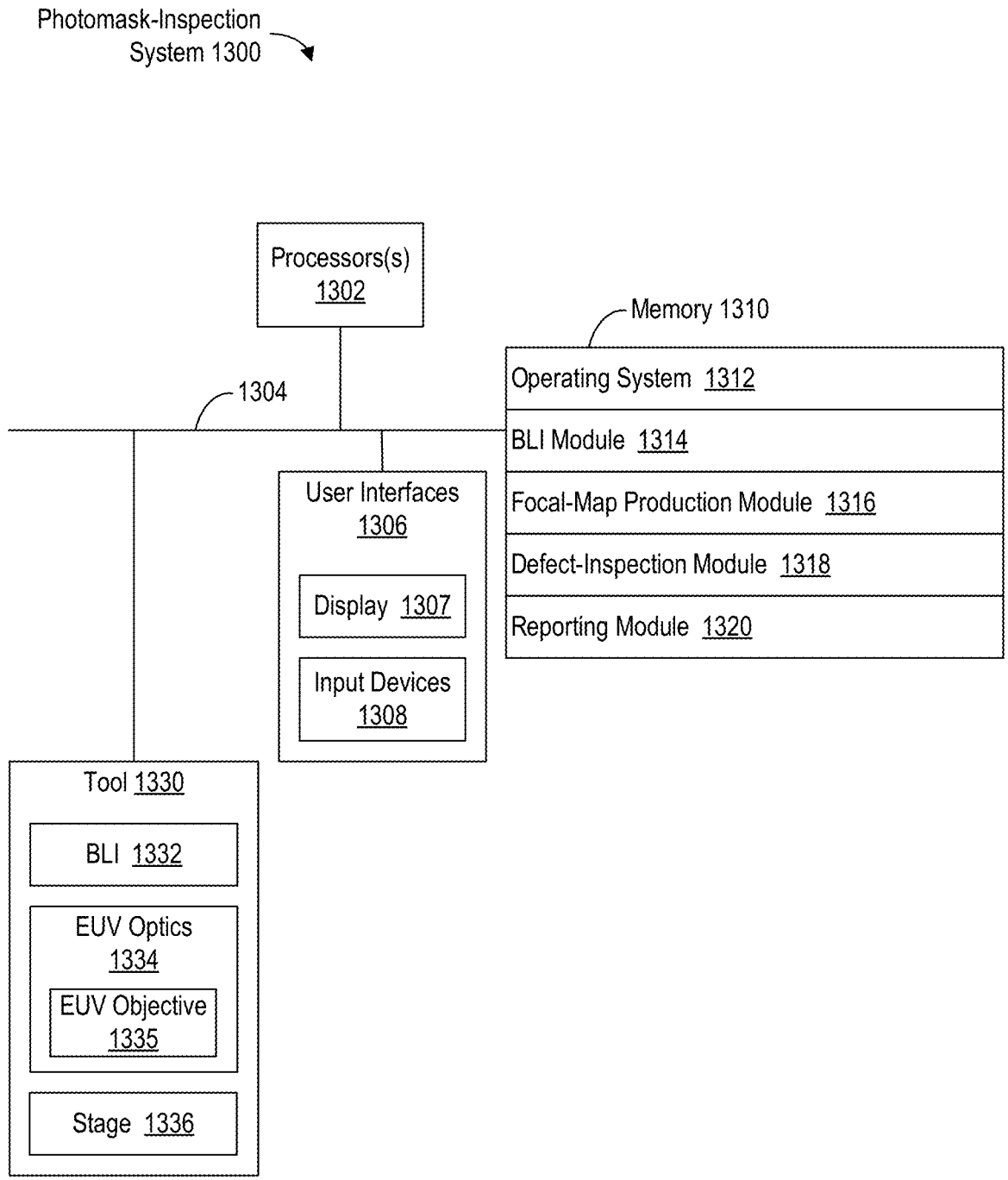
FIG. 13 is a block diagram of a photomask-inspection system in accordance with some embodiments.

FIG. 13 is a block diagram of a photomask-inspection system 1300 in accordance with some embodiments. The photomask-inspection system 1300 has an inspection tool 1330 (e.g., tool 900, FIG. 9; tool 1000, FIGS. 10A-10B), which including a broadband light interferometer (BLI) 1332 (e.g., the broadband light interferometer 100, FIG. 1; the broadband light interferometer of FIGS. 9 and/or 10A-10B) for measuring heights on photomasks (e.g., for generating interferograms that are used to create height images (e.g., z-height frames 1126, FIG. 11), such as the height image of FIG. 6), EUV optics 1334 for inspecting photomasks for defects, and a stage 1336 (e.g., stage 928, FIG. 9; 1028, FIGS. 10A-10B; 1116, FIG. 11) for supporting a photomask as wells as translating the photomask horizontally and vertically. The EUV optics 1334 include an EUV objective 1335 (e.g., EUV objective 904, FIG. 9; 1004, FIGS. 10A-10B). In some embodiments, the EUV optics 1334, including the EUV objective 1335, are designed for and use 13.5 nm light. In some embodiments, the broadband light interferometer 1332 is replaced with another type of optical height sensor.

The photomask-inspection system 1300 also includes a computer system with one or more processors 1302 (e.g., CPUs), optional user interfaces 1306, memory 1310, and one or more communication buses 1304 interconnecting these components and the tool 1330 (and other components of the photomask-inspection system 1300 that are not shown, such as photomask-handling robotics). The user interfaces 1306 may include a display 1307 and one or more input devices 1308 (e.g., a keyboard, mouse, touch-sensitive surface of the display 1307, etc.). The display may show height images, focal maps, and defect-inspection data and may report the status of the photomask-inspection system 1300 (e.g., the status of the method 800, FIG. 8 and/or the method 1200, FIG. 12).

Memory 1310 includes volatile and/or non-volatile memory. Memory 1310 (e.g., the non-volatile memory within memory 1310) includes a non-transitory computer-readable storage medium. Memory 1310 optionally includes one or more storage devices remotely located from the processor(s) 1302 and/or a non-transitory computer-readable storage medium that is removably inserted into the computer system of the photomask-inspection system 1300. In some embodiments, memory 1310 (e.g., the non-transitory computer-readable storage medium of memory 1310) stores the following modules and data, or a subset or superset thereof: an operating system 1312 that includes procedures for handling various basic system services and for performing hardware-dependent tasks, a broadband light interferometry (BLI) module 1314 for controlling the broadband light interferometer 1332, a focal-map production module 1316, a defect-inspection module 1318 for controlling photomask defect inspection using the EUV optics 1334, and a reporting module 1320 for reporting results from the modules 1314, 1316, and/or 1318. The memory 1310 (e.g., the non-transitory computer-readable storage medium of the memory 1310) includes instructions for performing all or a portion of the method 800 (FIG. 8) and/or the method 1200 (FIG. 12). Each of the modules stored in the memory 1310 corresponds to a set of instructions for performing one or more functions described herein. Separate modules need not be implemented as separate software programs. The modules and various subsets of the modules may be combined or otherwise re-arranged. In some embodiments, the memory 1310 stores a subset or superset of the modules and/or data structures identified above.

FIG. 13 is intended more as a functional description of the various features that may be present in the photomask-inspection system 1300 than as a structural schematic. A portion of the modules stored in the memory 1310 may alternatively be stored in one or more other computer systems communicatively coupled with the photomask-inspection system 1300 through one or more networks.

In some embodiments, the functionality of the computer system in the photomask-inspection system 1300 may be divided between multiple devices (e.g., multiple computers and controllers). For example, the photomask-inspection system 1300 may be an example of the photomask-inspection system 1100 and may include the image-processing computer 1102, height-sensor controller 1124, and stage controller 1110 (FIG. 11).

Figure 14:
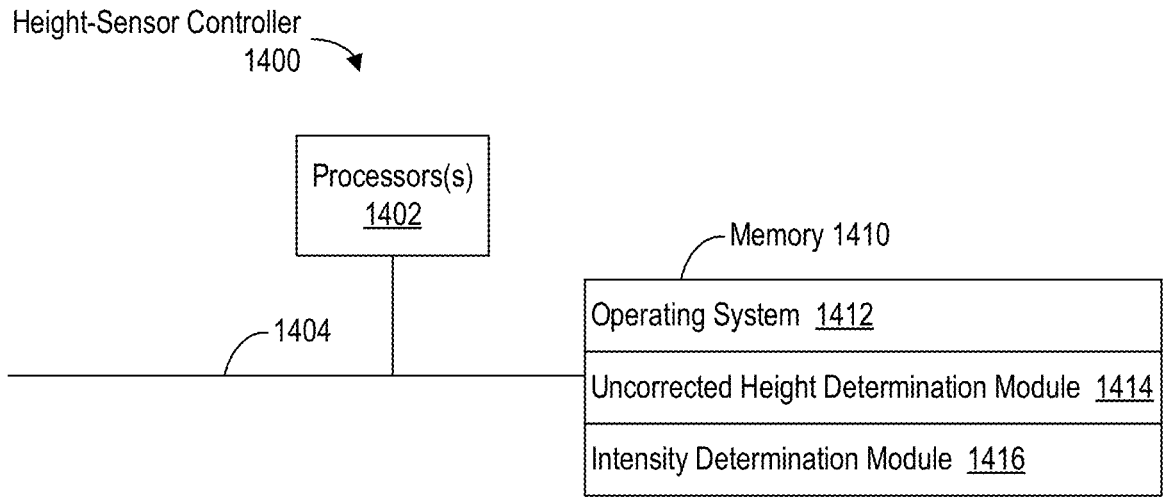
FIG. 14 is a block diagram of a height-sensor controller in accordance with some embodiments.

FIG. 14 is a block diagram of a height-sensor controller 1400 in accordance with some embodiments. The height-sensor controller 1400 is an example of the height-sensor controller 1124 (FIG. 11). The height-sensor controller 1400 includes one or more processors 1402 (e.g., CPUs), memory 1410, and one or more communication buses 1404 interconnecting these components. Memory 1410 includes volatile and/or non-volatile memory. Memory 1410 (e.g., the non-volatile memory within memory 1410) includes a non-transitory computer-readable storage medium. Memory 1410 optionally includes one or more storage devices remotely located from the processor(s) 1402 and/or a non-transitory computer-readable storage medium that is removably inserted into the height-sensor controller 1400. In some embodiments, memory 1410 (e.g., the non-transitory computer-readable storage medium of memory 1410) stores the following modules and data, or a subset or superset thereof: an operating system 1412 that includes procedures for handling various basic system services and for performing hardware-dependent tasks, an uncorrected height determination module 1414 for determining uncorrected heights of patterned areas on a photomask (e.g., for generating z-height frames 1126, FIG. 11) based on data from the broadband light interferometer 1332 (FIG. 13), and an intensity determination module 1416 for determining the intensity of light reflected from the photomask (e.g., for generating intensity frames 1128, FIG. 11). The memory 1410 (e.g., the non-transitory computer-readable storage medium of the memory 1410) may include instructions for performing all or a portion of steps 802 and/or 808 of the method 800 (FIG. 8) and/or all or a portion of step 1204 of the method 1200 (FIG. 12).

Each of the modules stored in the memory 1410 corresponds to a set of instructions for performing one or more functions described herein. Separate modules need not be implemented as separate software programs. The modules and various subsets of the modules may be combined or otherwise re-arranged. In some embodiments, the memory 1410 stores a subset or superset of the modules and/or data structures identified above.

Figure 15:
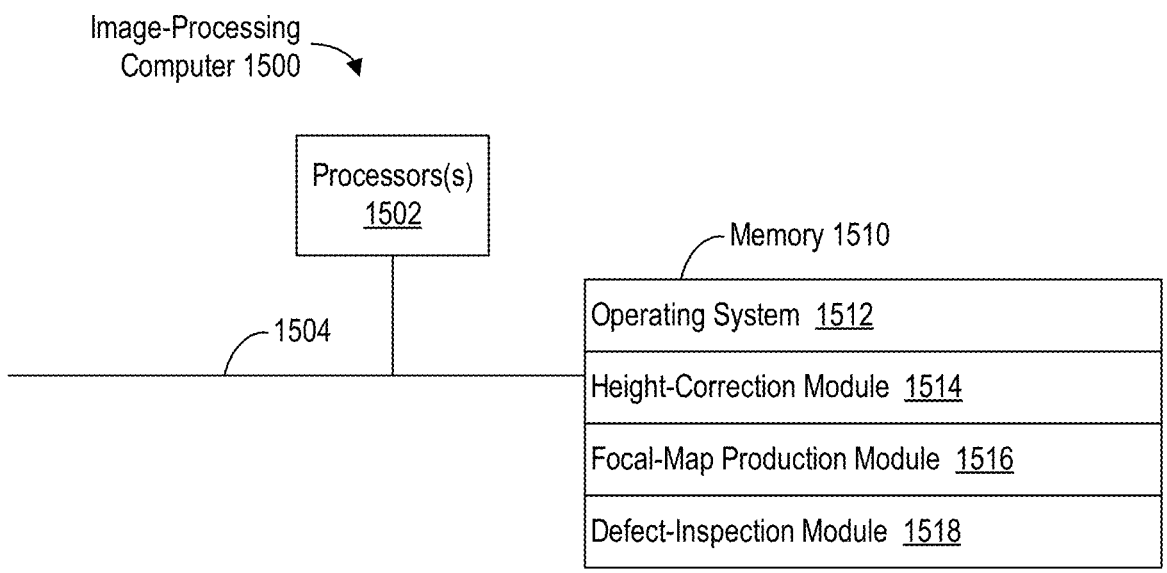
FIG. 15 is a block diagram of an image-processing computer in accordance with some embodiments.

FIG. 15 is a block diagram of an image-processing computer 1500 in accordance with some embodiments. The image-processing computer 1500 is an example of the image-processing computer 1102 (FIG. 11). The image-processing computer 1500 includes one or more processors 1502 (e.g., CPUs), memory 1510, and one or more communication buses 1504 interconnecting these components. Memory 1510 includes volatile and/or non-volatile memory. Memory 1510 (e.g., the non-volatile memory within memory 1510) includes a non-transitory computer-readable storage medium. Memory 1510 optionally includes one or more storage devices remotely located from the processor(s) 1502 and/or a non-transitory computer-readable storage medium that is removably inserted into the image-processing computer 1500. In some embodiments, memory 1510 (e.g., the non-transitory computer-readable storage medium of memory 1510) stores the following modules and data, or a subset or superset thereof: an operating system 1512 that includes procedures for handling various basic system services and for performing hardware-dependent tasks, a height-correction module 1514 for correcting the heights of patterned areas on the surface of a photomask (e.g., including adjusting the heights based on fill factors for the patterned areas), and a focal-map production module 1516 for generating a focal map (e.g., focal map 1108, FIG. 11) using the corrected heights. In some embodiments, the memory 1510 also stores a defect-inspection module 1518 for controlling photomask defect inspection (e.g., module 1318, FIG. 13). The memory 1510 (e.g., the non-transitory computer-readable storage medium of the memory 1510) may include instructions for performing all or a portion of steps 806, 810, 812, and/or 820 of the method 800 (FIG. 8) and/or all or a portion of steps 1216 and/or 1220 of the method 1200 (FIG. 12).

Each of the modules stored in the memory 1510 corresponds to a set of instructions for performing one or more functions described herein. Separate modules need not be implemented as separate software programs. The modules and various subsets of the modules may be combined or otherwise re-arranged. In some embodiments, the memory 1510 stores a subset or superset of the modules and/or data structures identified above.

FIGS. 14 and 15 are intended more as functional descriptions of the various features that may be present in the height-sensor controller 1400 and the image-processing computer 1500 than as structural schematics.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A photomask-inspection system, comprising:
   a vacuum chamber;
   a stage, disposed in the vacuum chamber, to support a photomask and to translate the photomask horizontally and vertically;
   an optical height sensor, at least partially disposed in the vacuum chamber, to measure heights on a surface of the photomask, wherein the optical height sensor is to use light that is not extreme ultraviolet (EUV) light and that has wavelengths longer than EUV light;
   a stage controller to translate the stage horizontally and vertically in accordance with a focal map for the photomask produced using the measured heights on the surface of the photomask; and
   an EUV objective, disposed in the vacuum chamber, to collect EUV light from the photomask in accordance with the focal map, in order to inspect the photomask for defects;
   one or more processors; and
   memory storing one or more programs for execution by the one or more processors, the one or more programs comprising instructions for producing the focal map using the measured heights on the surface of the photomask, wherein:
      the measured heights comprise measured heights of patterned areas on the photomask,
      the instructions for producing the focal map comprise instructions for adjusting the measured heights of the patterned areas based on fill factors for the patterned areas, and
      the instructions for producing the focal map further comprise instructions for applying a height offset to the adjusted heights to account for a height difference between the adjusted heights and an EUV focal position, in accordance with a calibration height-offset map.

2. The system of claim 1, wherein the optical height sensor comprises an objective disposed in the vacuum chamber and situated off-axis from the EUV objective.

3. The system of claim 1, wherein the EUV light is 13.5 nm light.

4. The system of claim 1, wherein:
   the optical height sensor comprises a broadband light interferometer; and
   the broadband light interferometer comprises an interferometric objective disposed in the vacuum chamber.

5. The system of claim 4, wherein:
   the broadband light interferometer further comprises a broadband light source disposed outside of the vacuum chamber and an image sensor disposed outside of the vacuum chamber; and
   the vacuum chamber comprises a window in an exterior wall of the vacuum chamber to pass light for the broadband light interferometer.

6. The system of claim 5, wherein the broadband light interferometer further comprises:
   a beam splitter, disposed outside of the vacuum chamber, to direct light from the broadband light source through the window to the interferometric objective; and
   a tube lens, disposed outside of the vacuum chamber between the beam splitter and the image sensor, to focus light from the interferometric objective onto the image sensor.

7. The system of claim 4, wherein the interferometric objective is mechanically coupled to the EUV objective.

8. The system of claim 7, wherein:
   the interferometric objective is connected to a bottom surface of the EUV objective; and
   the bottom surface of the EUV objective faces the stage.

9. The system of claim 1, wherein the one or more programs further comprise instructions for calculating the fill factors based on a database of the design for the photomask.

10. The system of claim 1, wherein:
    the optical height sensor comprises a broadband light interferometer; and
    the one or more programs further comprise instructions for:
       determining reflectivities of the patterned areas based on data from the broadband light interferometer; and
       determining the fill factors based on the reflectivities.

11. The system of claim 1, comprising a height-sensor controller and an image-processing computer, wherein:
    the height-sensor controller comprises one or more first processors and a first memory, the first memory storing one or more first programs for execution by the one or more first processors, the one or more first programs comprising instructions for determining the measured heights of patterned areas on the photomask based on data from the optical height sensor; and
    the image-processing computer comprises one or more second processors and a second memory, the second memory storing one or more second programs for execution by the one or more second processors, the one or more second programs comprising the instructions for producing the focal map.

12. The system of claim 11, wherein the instructions for producing the focal map further comprise instructions for applying a height offset to the adjusted heights to account for a height difference between the adjusted heights and an EUV focal position, in accordance with a calibration height-offset map.

13. The system of claim 1, wherein the stage controller is configured to send synchronization signals to the optical height sensor to control operation of the optical height sensor.

14. The system of claim 13, wherein the synchronization signals provide information corresponding to the vertical translation of the photomask.

15. A method, comprising:
    positioning a photomask on a stage in a vacuum chamber;
    measuring heights of patterned areas on a surface of the photomask using an optical height sensor that is at least partially disposed in the vacuum chamber, wherein the optical height sensor uses light that is not extreme ultraviolet (EUV) light and that has wavelengths longer than EUV light;
    producing a focal map for the photomask using the measured heights on the surface of the photomask, comprising:
       adjusting the measured heights of the patterned areas based on fill factors for the patterned areas, and
       applying a height offset to the adjusted heights to account for a height difference between the adjusted heights and an EUV focal position, in accordance with a calibration height-offset map; and inspecting the photomask for defects using an EUV objective disposed in the vacuum chamber, comprising:
translating the stage horizontally and vertically in accordance with the focal map; and
collecting EUV light from the photomask using the EUV objective in accordance with the focal map.

16. The method of claim 15, wherein:
the optical height sensor comprises an objective disposed in the vacuum chamber and situated off-axis from the EUV objective; and
inspecting the photomask for defects is performed using 13.5 nm light.

17. The method of claim 15, wherein:
the optical height sensor comprises a broadband light interferometer comprising an interferometric objective disposed in the vacuum chamber, a broadband light source disposed outside of the vacuum chamber, and an image sensor disposed outside of the vacuum chamber; and
measuring the heights of the patterned areas comprises:
providing light from the broadband light source through a window in an exterior wall of the vacuum chamber to the interferometric objective, and
receiving, at the image sensor, light from the interferometric objective that passes through the window.

18. The method of claim 17, wherein:
the vacuum chamber comprises a plate that divides the vacuum chamber into a first sub-chamber and a second sub-chamber;
the EUV objective and the interferometric objective are disposed in the first sub-chamber;
the stage is disposed in the second sub-chamber;
measuring the heights of the patterned areas further comprises illuminating the photomask with light from the interferometric objective through a window in the plate; and
inspecting the photomask for defects comprises illuminating the photomask with EUV light from the EUV objective through a hole in the plate.

19. The method of claim 15, further comprising generating the calibration height-offset map using a calibration photomask with a grid of fixed patterns at known locations.

20. The method of claim 15, wherein:
measuring the heights of the patterned areas comprises:
transmitting data from the optical height sensor to a height-sensor controller, and in the height-sensor controller, determining the measured heights of patterned areas on the photomask based on the data from the optical height sensor; and
producing the focal map comprises:
transmitting the measured heights from the height-sensor controller to an image-processing computer, and
in the image-processing computer, correcting the measured heights of the patterned areas, comprising adjusting the measured heights of the patterned areas based on fill factors for the patterned areas and applying a height offset to the adjusted heights to account for a height difference between the adjusted heights and an EUV focal position, in accordance with a calibration height-offset map.

21. The method of claim 15, further comprising:
pausing the inspecting;
while the inspecting is paused, repeating the measuring and the producing to produce an updated focal map; and
resuming the inspecting using the updated focal map.

22. The method of claim 15, wherein measuring the heights of the patterned areas comprises:
controlling horizontal and vertical translation of the stage using a stage controller; and
sending synchronization signals from the stage controller to the optical height sensor to control operation of the optical height sensor.

23. The method of claim 22, wherein the synchronization signals provide information corresponding to the vertical translation of the photomask.

24. A photomask-inspection system, comprising:
a vacuum chamber comprising a plate that divides the vacuum chamber into a first sub-chamber and a second sub-chamber;
a stage, disposed in the second sub-chamber of the vacuum chamber, to support a photomask and to translate the photomask horizontally and vertically;
an optical height sensor, at least partially disposed in the vacuum chamber, to measure heights on a surface of the photomask, wherein:
the optical height sensor comprises a broadband light interferometer,
the broadband light interferometer comprises an interferometric objective disposed in the first-sub-chamber of the vacuum chamber, and
the optical height sensor is to use light that is not extreme ultraviolet (EUV) light and that has wavelengths longer than EUV light;
a stage controller to translate the stage horizontally and vertically in accordance with a focal map for the photomask produced using the measured heights on the surface of the photomask; and
an EUV objective, disposed in the first-sub-chamber of the vacuum chamber, to collect EUV light from the photomask in accordance with the focal map, in order to inspect the photomask for defects,
wherein the plate comprises:
a window to pass light between the interferometric objective and the photomask, and
a hole to pass the EUV light between the photomask and the EUV objective.

* * * * *